(12) United States Patent
Shu et al.

(10) Patent No.: US 10,937,795 B2
(45) Date of Patent: Mar. 2, 2021

(54) SEAL METHOD TO INTEGRATE NON-VOLATILE MEMORY (NVM) INTO LOGIC OR BIPOLAR CMOS DMOS (BCD) TECHNOLOGY

(71) Applicant: Taiwan Semiconductor Manufacturing Co., Ltd., Hsin-Chu (TW)

(72) Inventors: Cheng-Bo Shu, Tainan (TW); Chung-Jen Huang, Tainan (TW); Yun-Chi Wu, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/560,028

(22) Filed: Sep. 4, 2019

(65) Prior Publication Data
US 2020/0006365 A1 Jan. 2, 2020

Related U.S. Application Data

(62) Division of application No. 15/904,836, filed on Feb. 26, 2018, now Pat. No. 10,504,912.
(Continued)

(51) Int. Cl.
*H01L 27/11546* (2017.01)
*H01L 29/06* (2006.01)
(Continued)

(52) U.S. Cl.
CPC .. *H01L 27/11546* (2013.01); *H01L 21/02236* (2013.01); *H01L 21/28211* (2013.01);
(Continued)

(58) Field of Classification Search
CPC .......... G11C 14/0063; H01L 29/42332; H01L 21/28273; H01L 27/11534;
(Continued)

(56) References Cited

U.S. PATENT DOCUMENTS 5,767,018 A 6/1998 Bell
5,801,082 A * 9/1998 Tseng ................ H01L 21/76237
148/DIG. 50
(Continued)

FOREIGN PATENT DOCUMENTS

JP 2010080709 A 4/2010

OTHER PUBLICATIONS

Non-Final Office Action dated Feb. 13, 2019 for U.S. Appl. No. 15/904,836.
(Continued)

*Primary Examiner* — Jarrett J Stark
(74) *Attorney, Agent, or Firm* — Eschweiler & Potashnik, LLC

(57) ABSTRACT

Various embodiments of the present application are directed towards a method to integrate NVM devices with a logic or BCD device. In some embodiments, an isolation structure is formed in a semiconductor substrate. The isolation structure demarcates a memory region of the semiconductor substrate, and further demarcates a peripheral region of the semiconductor substrate. The peripheral region may, for example, correspond to BCD device or a logic device. A doped well is formed in the peripheral region. A dielectric seal layer is formed covering the memory and peripheral regions, and further covering the doped well. The dielectric seal layer is removed from the memory region, but not the peripheral region. A memory cell structure is formed on the memory region using a thermal oxidation process. The dielectric seal layer is removed from the peripheral region, and a peripheral
(Continued)

device structure including a gate electrode is formed on the peripheral region.

20 Claims, 19 Drawing Sheets

Related U.S. Application Data

(60) Provisional application No. 62/538,219, filed on Jul. 28, 2017.

(51) Int. Cl.

| | |
|---|---|
| H01L 27/11521 | (2017.01) |
| H01L 21/28 | (2006.01) |
| H01L 29/423 | (2006.01) |
| H01L 21/8249 | (2006.01) |
| H01L 27/112 | (2006.01) |
| H01L 27/11568 | (2017.01) |
| H01L 27/11573 | (2017.01) |
| H01L 21/02 | (2006.01) |
| H01L 29/78 | (2006.01) |
| H01L 27/06 | (2006.01) |
| H01L 21/8234 | (2006.01) |
| H01L 29/788 | (2006.01) |
| H01L 27/11524 | (2017.01) |
| H01L 29/08 | (2006.01) |
| H01L 29/66 | (2006.01) |
| H01L 21/762 | (2006.01) |
| H01L 21/3213 | (2006.01) |
| H01L 21/027 | (2006.01) |
| H01L 29/10 | (2006.01) |
| H01L 29/51 | (2006.01) |
| H01L 21/8238 | (2006.01) |

(52) U.S. Cl.
CPC .. *H01L 21/8249* (2013.01); *H01L 21/823462* (2013.01); *H01L 27/0623* (2013.01); *H01L 27/11206* (2013.01); *H01L 27/11521* (2013.01); *H01L 27/11524* (2013.01); *H01L 27/11568* (2013.01); *H01L 27/11573* (2013.01); *H01L 29/0649* (2013.01); *H01L 29/0653* (2013.01); *H01L 29/0878* (2013.01); *H01L 29/40114* (2019.08); *H01L 29/40117* (2019.08); *H01L 29/42328* (2013.01); *H01L 29/42364* (2013.01); *H01L 29/66689* (2013.01); *H01L 29/66825* (2013.01); *H01L 29/7816* (2013.01); *H01L 29/7881* (2013.01); *H01L 21/0274* (2013.01); *H01L 21/02255* (2013.01); *H01L 21/32133* (2013.01); *H01L 21/76224* (2013.01); *H01L 21/76229* (2013.01); *H01L 21/76232* (2013.01); *H01L 21/823481* (2013.01); *H01L 21/823878* (2013.01); *H01L 29/086* (2013.01); *H01L 29/0847* (2013.01); *H01L 29/1083* (2013.01); *H01L 29/1095* (2013.01); *H01L 29/42344* (2013.01); *H01L 29/513* (2013.01); *H01L 29/6656* (2013.01); *H01L 29/66681* (2013.01); *H01L 29/7833* (2013.01)

(58) Field of Classification Search
CPC ............. H01L 27/11524; H01L 29/511; H01L 21/26513; H01L 29/518; H01L 27/1288; H01L 27/11546; H01L 29/40114; H01L 29/40117; H01L 29/0649; H01L 27/11521; H01L 21/28211; H01L 29/42364; H01L 21/8249; H01L 27/11206; H01L 27/11568; H01L 27/11573; H01L 21/02236; H01L 29/7816; H01L 29/42328; H01L 21/76224

See application file for complete search history.

(56) References Cited

U.S. PATENT DOCUMENTS

| | | | |
|---|---|---|---|
| 5,989,978 A * | 11/1999 | Peidous | H01L 21/76202 257/E21.549 |
| 6,096,595 A | 8/2000 | Huang et al. | |
| 6,222,241 B1 | 4/2001 | Plat | |
| 6,251,749 B1 * | 6/2001 | Kuroda | H01L 21/76224 257/510 |
| 6,346,442 B1 | 2/2002 | Aloni et al. | |
| 6,455,374 B1 | 9/2002 | Lee et al. | |
| 7,804,133 B2 | 9/2010 | Murata et al. | |
| 7,821,055 B2 | 10/2010 | Loiko et al. | |
| 7,888,729 B2 * | 2/2011 | Cheng | H01L 29/7881 257/314 |
| 7,955,960 B2 | 6/2011 | Kim et al. | |
| 8,329,545 B1 | 12/2012 | Meotto et al. | |
| 8,350,331 B2 * | 1/2013 | Tsujiuchi | H01L 27/1203 257/213 |
| 8,372,699 B2 | 2/2013 | Kang et al. | |
| 8,809,179 B2 * | 8/2014 | Wang | H01L 27/105 257/E27.078 |
| 8,883,624 B1 | 11/2014 | Ramkumar | |
| 8,901,632 B1 * | 12/2014 | Perera | H01L 29/7831 257/314 |
| 8,993,457 B1 * | 3/2015 | Ramkumar | H01L 21/0223 438/763 |
| 9,275,864 B2 | 3/2016 | Perera et al. | |
| 9,541,521 B1 | 1/2017 | Hogue et al. | |
| 9,691,895 B2 | 6/2017 | Liu et al. | |
| 9,704,875 B2 | 7/2017 | Yamaguchi | |
| 9,831,340 B2 | 11/2017 | Chu et al. | |
| 10,134,748 B2 | 11/2018 | Liu et al. | |
| 2002/0003275 A1 * | 1/2002 | Lee | H01L 21/76224 257/510 |
| 2003/0008458 A1 | 1/2003 | Hashimoto et al. | |
| 2005/0106815 A1 | 5/2005 | Knoefler | |
| 2006/0118854 A1 | 6/2006 | Lee | |
| 2006/0220097 A1 | 10/2006 | Ogura | |
| 2008/0003734 A1 | 1/2008 | Chuang et al. | |
| 2009/0243031 A1 * | 10/2009 | Natzle | H01L 21/28123 257/508 |
| 2009/0273013 A1 | 11/2009 | Winstead et al. | |
| 2010/0052094 A1 * | 3/2010 | Carter | H01L 21/76232 257/510 |
| 2010/0059732 A1 | 3/2010 | Chang | |
| 2010/0184260 A1 | 7/2010 | Luo et al. | |
| 2011/0198696 A1 * | 8/2011 | Choi | H01L 29/66795 257/347 |
| 2011/0263089 A1 | 10/2011 | Park | |
| 2011/0291200 A1 | 12/2011 | Keshavarzi et al. | |
| 2012/0223369 A1 | 9/2012 | Gupta et al. | |
| 2014/0001565 A1 * | 1/2014 | Choi | H01L 21/823842 257/369 |
| 2015/0137206 A1 | 5/2015 | Liu et al. | |
| 2015/0171102 A1 * | 6/2015 | Ishida | H01L 27/11573 438/587 |
| 2016/0005756 A1 | 1/2016 | Chuang et al. | |
| 2016/0020219 A1 * | 1/2016 | Chuang | H01L 29/0649 257/324 |
| 2016/0064533 A1 * | 3/2016 | Owada | H01L 27/11568 438/287 |
| 2016/0181268 A1 * | 6/2016 | Chuang | H01L 21/823842 257/314 |
| 2016/0204128 A1 * | 7/2016 | Baars | H01L 27/0629 257/296 |
| 2016/0260728 A1 | 9/2016 | Chen et al. | |
| 2017/0104011 A1 * | 4/2017 | Zang | H01L 21/84 |
| 2017/0170188 A1 | 6/2017 | Wu et al. | |
| 2017/0229562 A1 | 8/2017 | Katou | |

(56) References Cited

U.S. PATENT DOCUMENTS

2018/0083019 A1   3/2018  Wu et al.
2018/0090508 A1*  3/2018  Ogata .................. H01L 23/535
2019/0035799 A1   1/2019  Shu et al.

OTHER PUBLICATIONS

Final Office Action dated Jun. 11, 2019 for U.S. Appl. No. 15/904,836.
Notice of Allowance dated Jul. 29, 2019 for U.S. Appl. No. 15/904,836.

* cited by examiner

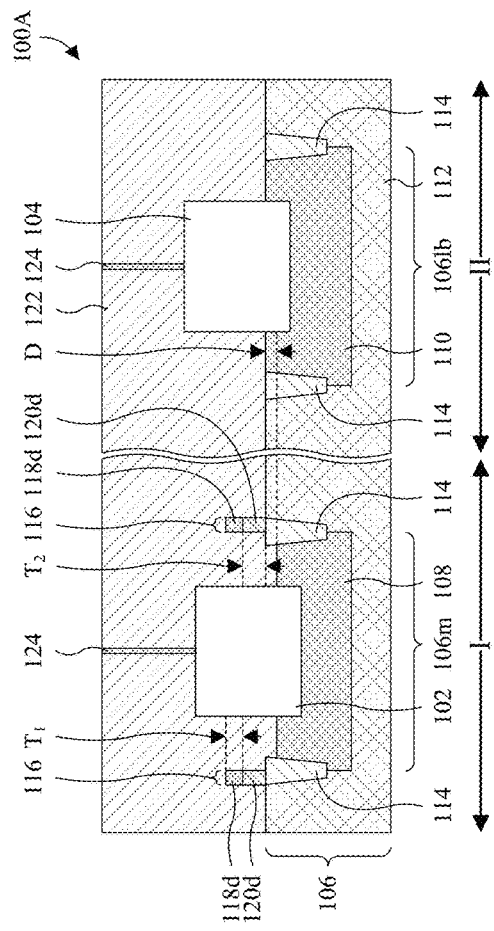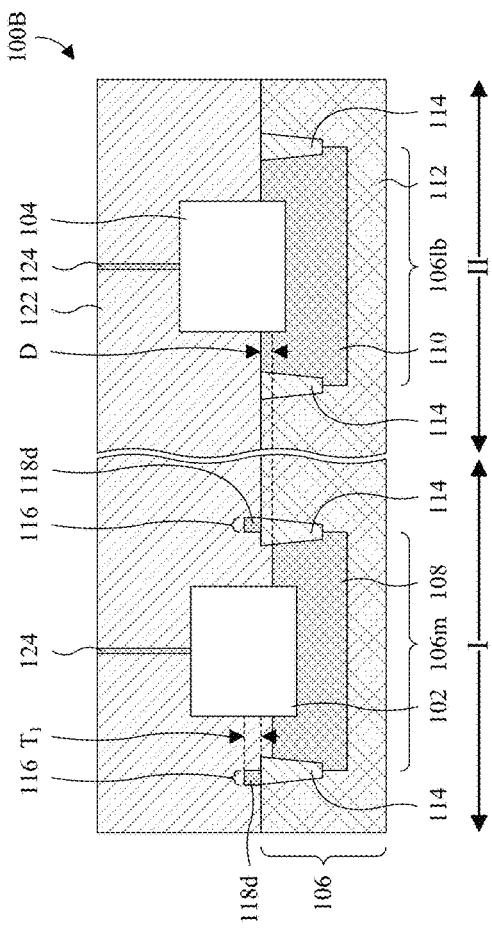

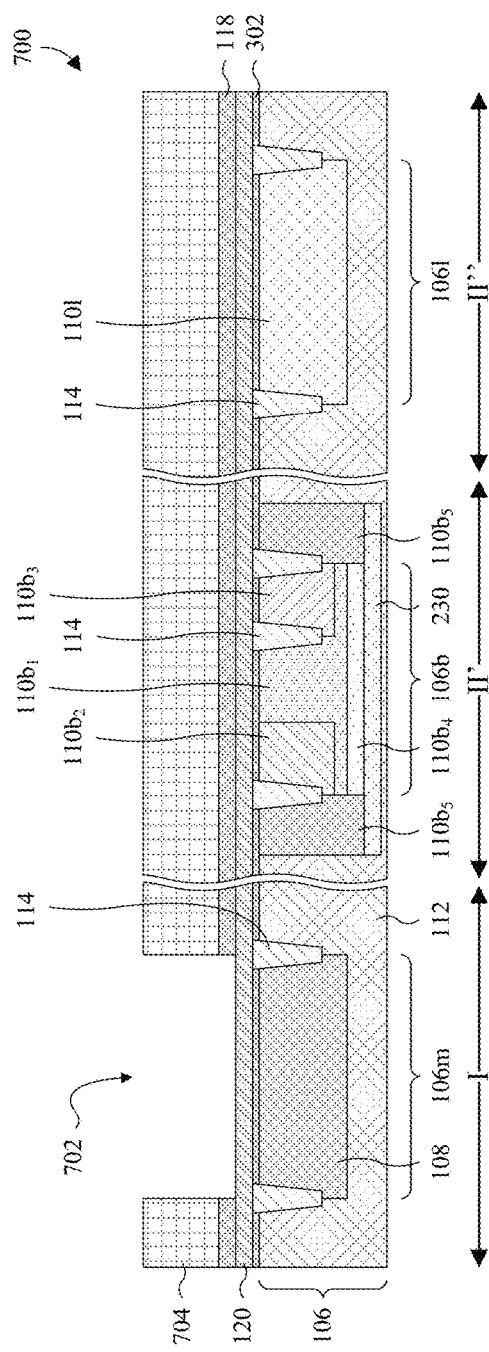
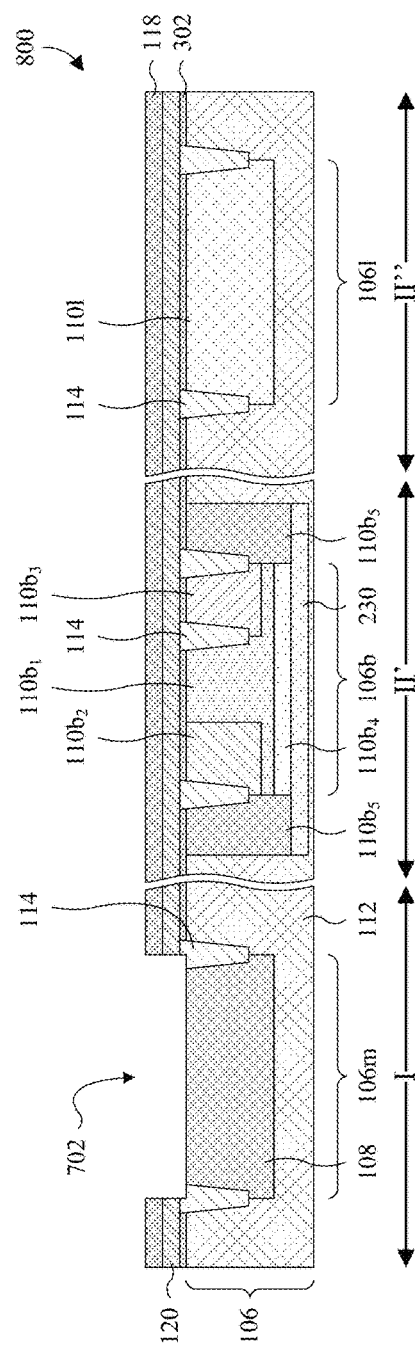
Fig. 7
Fig. 8

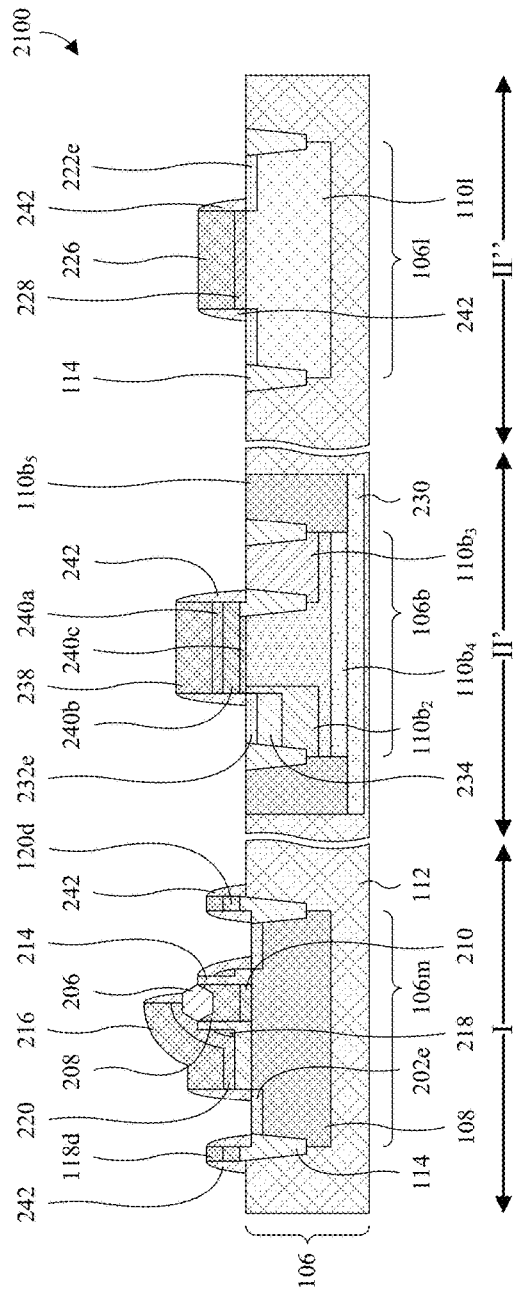
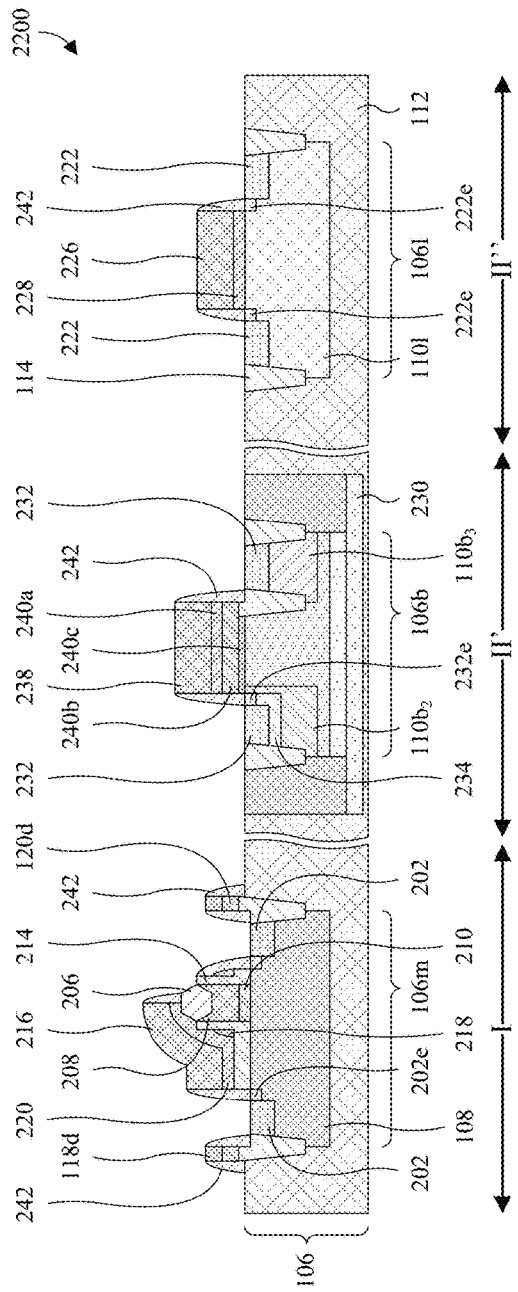
Fig. 21
Fig. 22

SEAL METHOD TO INTEGRATE NON-VOLATILE MEMORY (NVM) INTO LOGIC OR BIPOLAR CMOS DMOS (BCD) TECHNOLOGY

REFERENCE TO RELATED APPLICATIONS

This Application is a Divisional of U.S. application Ser. No. 15/904,836, filed on Feb. 26, 2018, which claims the benefit of U.S. Provisional Application No. 62/538,219, filed on Jul. 28, 2017. The contents of the above-referenced patent applications are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component that can be created) has generally decreased. A development in the evolution of ICs includes the integration of non-volatile memory (NVM) with logic technology or bipolar complementary metal-oxide-semiconductor (CMOS) double-diffused metal-oxide-semiconductor (DMOS) (BCD) technology. BCD technology may be or comprise, for example, the integration of bipolar junction transistors (BJTs), CMOS devices, and DMOS devices together on the same semiconductor chip. Among other things, integrating NVM with logic or BCD technology finds application in power management, the internet of things (IoT), smart cards, microcontroller units (MCUs), and automotive devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B illustrate cross-sectional views of various embodiments of an integrated circuit (IC) comprising a memory device and a bipolar complementary metal-oxide-semiconductor (CMOS) double-diffused metal-oxide-semiconductor (DMOS) (BCD) or logic device.

FIGS. 3-23 illustrate a series of cross-sectional views of some embodiments of a seal method to form an IC comprising a memory device and a BCD or logic device.

DETAILED DESCRIPTION

Figure 2A:
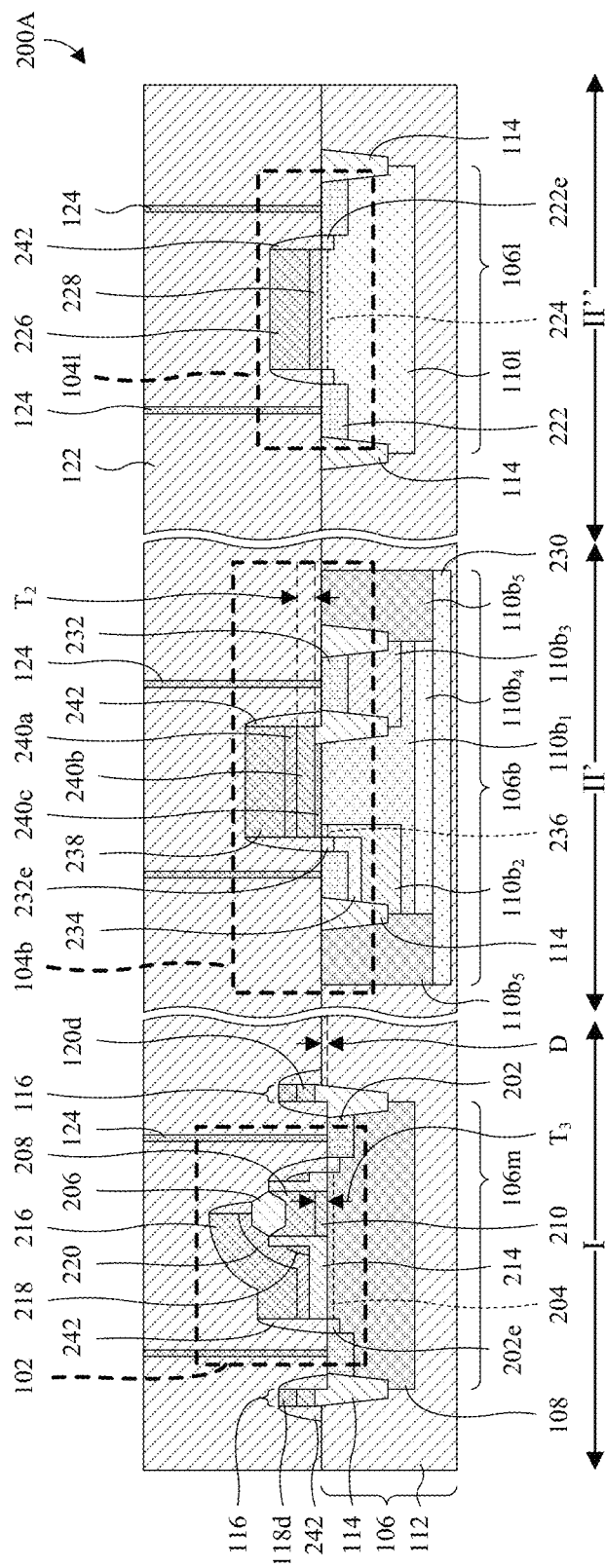
FIGS. 2A and 2B illustrate cross-sectional views of some more detailed embodiments respectively of the ICs of FIGS. 1A and 1B.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method for integrating a non-volatile memory (NVM) device with a logic device and/or a bipolar complementary metal-oxide-semiconductor (CMOS) double-diffused metal-oxide-semiconductor (DMOS) (BCD) device comprises forming a shallow trench isolation (STI) structure extending into a top surface of a semiconductor substrate and demarcating a memory region of the semiconductor substrate, a logic region of the semiconductor substrate, and a BCD region of the semiconductor substrate. A BCD well and a logic well are respectively formed in the BCD region and the logic region, and a BCD gate oxide layer is subsequently formed covering the logic, BCD, and memory regions. The BCD gate oxide layer is removed from the memory region, but not the logic and BCD regions, and a series of processes is performed to form a memory structure on the memory region. The processes include thermal and oxidation processes, and the memory structure includes a memory gate oxide layer. Thereafter, the BCD gate oxide layer is removed from the logic region, but not the BCD region, and a series of processes is performed to form a logic gate oxide layer on the logic region. A conductive layer is formed covering the memory, logic, and BCD regions, and the conductive layer is patterned into a memory gate electrode, a logic gate electrode, and a BCD gate electrode.

A challenge with the method is that the thermal and oxidation processes used to form the memory structure may impact the logic and BCD devices under manufacture. For example, an oxidant used during the thermal and oxidation processes may migrate to the logic and BCD regions, through the BCD gate oxide layer, and promote oxidation of the logic and BCD regions. Such oxidation partially consumes the logic and BCD regions, thereby reducing the depth of the logic and BCD wells and changing the doping profiles of the logic and BCD wells. By changing the doping profiles of the logic and BCD wells, the thermal and oxidation processes lead to large shifts in performance parameters of the logic and BCD devices. The thermal and oxidation processes include, for example, processes performed at temperatures in excess of about 850 degrees Celsius, and/or at temperatures between about 850-1000 degrees Celsius, about 750-950 degrees Celsius, or about 850-1250 degrees Celsius. A solution to the challenge is to use p-type metal-oxide-semiconductor (PMOS) one-time programmable (OTP) memory since the memory may be formed without the thermal and oxidation processes. However, the PMOS OTP memory is one time programmable, and hence has limited applications.

In view of the foregoing, various embodiments of the present application are directed towards a seal method to integrate a NVM device with a logic or BCD device using a seal layer, as well as an integrated circuit (IC) resulting from the method. In accordance with some embodiments of the method, an isolation structure is formed in a semiconductor substrate. The isolation structure separates a memory region of the semiconductor substrate from a peripheral region of the semiconductor substrate. A doped well is formed in the peripheral region. The seal layer is formed covering the memory and peripheral regions, and further covering the doped well. The seal layer may, for example, be a dielectric, and/or may be or comprise, for example, silicon nitride, silicon oxynitride, silicon carbide, polysilicon (doped or undoped), or some other suitable seal material. The seal layer is removed from the memory region, but not the peripheral region, and a memory cell structure is formed on the memory region using thermal and oxidation processes. The seal layer is removed from the peripheral region, and a logic or BCD device structure is formed on the peripheral region.

The seal layer protects the peripheral region, including the doped well, from the thermal and oxidation processes used to form the memory cell structure. For example, the seal layer may block an oxidant used during the thermal and oxidation processes from migrating to the peripheral region and causing oxidation and consumption of the peripheral region. Such oxidation and consumption reduces a depth of the doped well and, hence, changes a doping profile of the doped well. Accordingly, the seal layer prevents a shift in the doping profile of the doped well, which prevents a performance shift of the logic or BCD device formed on the doped well. This, in turn, leads to high yields during bulk manufacture of the IC.

With reference to FIG. 1A, a cross-sectional view 100A of some embodiments of an IC comprising a memory cell 102 and a logic or BCD device 104 is provided. The memory cell 102 is in a first section I of the IC, on a memory region 106m of a semiconductor substrate 106. Further, the memory cell 102 overlies a memory well 108 in the memory region 106m. The memory cell 102 may be, for example, a first generation embedded superflash (ESF1) device, a third generation embedded superflash (ESF3) device, a 1.5 transistor silicon-oxide-nitride-oxide-silicon (SONOS) device, a two transistor SONOS device, a 1.5 transistor metal-oxide-nitride-oxide-silicon (MONOS) device, a two transistor MONOS device, a one transistor floating gate device, a two transistor floating gate device, a thin film storage (TFS) device, or some other suitable memory cell. The semiconductor substrate 106 may be or comprise, for example, a bulk silicon substrate, a silicon epitaxial layer, a silicon-on-insulator substrate (SOI), some other suitable semiconductor structure(s), or any combination of the foregoing. As used herein, a term (e.g., semiconductor structure) with a suffix of "(s)" may, for example, be singular or plural. In some embodiments, the semiconductor substrate 106 comprises a bulk silicon substrate (not shown) and the silicon epitaxial layer (not shown) covering the bulk silicon substrate.

The logic or BCD device 104 is in a second section II of the IC, on a logic or BCD region 106lb of the semiconductor substrate 106. In some embodiments, the logic or BCD region 106lb of the semiconductor substrate 106 is at a periphery of the IC and/or a periphery of the memory region 106m of the semiconductor substrate 106. Further, the logic or BCD device 104 overlies a logic or BCD well 110 in the logic or BCD region 106lb. In some embodiments, the logic or BCD well 110 has a top surface that is elevated above a top surface of the memory well 108 by a distance D. The distance D may be, for example, about 10-100 angstroms, about 40-60 angstroms, or about 25-75 angstroms. The logic or BCD device 104 may be, for example, a metal-oxide-semiconductor (MOS) device, a DMOS device, a bipolar junction transistor (BJT), or some other suitable logic or BCD device.

The memory well 108 and the logic or BCD well 110 have different doping profiles, different doping concentrations, different doping types, or any combination of the foregoing relative to each other and/or relative to a bulk 112 of the semiconductor substrate 106. In some embodiments, the memory well 108 has a single doping type and/or the logic or BCD well 110 has a single doping type. Further, the memory well 108 and the logic or BCD well 110 are surrounded by an isolation structure 114 extending into a top surface of the semiconductor substrate 106. The isolation structure 114 comprises a pair of memory segments on opposite sides of the memory well 108. Similarly, the isolation structure 114 comprises a pair of logic or BCD segments on opposite sides of the logic or BCD well 110. The isolation structure 114 may be or comprise, for example, a shallow trench isolation (STI) structure, a deep trench isolation (DTI) structure, or some other suitable isolation structure.

In some embodiments, a dummy structure 116 is on the memory region 106m of the semiconductor substrate 106, adjacent to the memory cell 102. In some embodiments, the dummy structure 116 also overlies the memory segments of the isolation structure 114. The dummy structure 116 comprises a pair of dummy segments on opposite sides of the memory cell 102. In some embodiments, a planar top layout of the dummy structure 116 extends laterally in a closed path, along a boundary of the memory well 108, to completely enclose the memory well 108, and/or is continuous from one of the dummy segments to another one of the dummy segments along the closed path. The closed path may, for example, be circular ring-shaped, square ring-shaped, rectangular ring-shaped, or some other suitable closed-path shape. Note that this is not visible within the cross-sectional view 100A of FIG. 1A since the closed path extends outside the cross-sectional view 100A of FIG. 1A (e.g., into and out of the page). The dummy structure 116 is defined by a dummy seal element 118d and, in some embodiments, a dummy dielectric element 120d underlying the dummy seal element 118d.

In some embodiments, the dummy seal element 118d has a first thickness $T_1$ of about 100-500 angstroms, about 100-250 angstroms, about 250-500 angstroms, about 150-350 angstroms, about 50-150 angstroms, or about 450-550 angstroms. In some embodiments, the dummy dielectric element 120d has a second thickness $T_2$ of about 60-200 angstroms, about 60-130 angstroms, about 130-200 angstroms, about 20-100 angstroms, or about 160-240 angstroms. In some embodiments, the first thickness $T_1$ is about 0.5-8.5 times the second thickness $T_2$, about 0.25-0.75 times the second thickness $T_2$, about 8-9 times the second thickness $T_2$, about 1-5 times the second thickness $T_2$, or about 4-9 times the second thickness $T_2$.

As seen hereafter, a seal layer is used to protect the logic or BCD well 110 while performing a method for forming the IC. Further, as seen hereafter, the seal layer is mostly removed while performing the method, and the dummy seal element 118d is a leftover portion of the seal layer. Similarly, as seen hereafter, the dummy dielectric element 120d is a leftover portion of a dielectric layer from which a BCD gate dielectric layer is formed for a BCD device. The dummy seal element 118d may be or comprise, for example, silicon nitride, silicon oxynitride, silicon carbide, some other suitable dielectric(s), polysilicon (doped or undoped), or any combination of the foregoing. Further, the dummy seal element 118d may be a material that blocks or otherwise prevents oxidants from passing therethrough. The dummy dielectric element 120d may, for example, silicon oxide, some other suitable oxide(s), a high κ dielectric, some other suitable dielectric(s), or any combination of the foregoing. As used herein, a high κ dielectric may be, for example, a dielectric with a dielectric constant κ greater than about 3.9, 5, 10, 15, or 20. In some embodiments, the dummy seal element 118d is homogeneous (e.g., a single material) and/or the dummy dielectric element 120d is homogeneous.

An interlayer dielectric (ILD) layer 122 covers the semiconductor substrate 106, the dummy structure 116, the memory cell 102, the logic or BCD device 104, and the isolation structure 114. Further, contact vias 124 extend through the ILD layer 122 and electrically couple with the memory cell 102 and the logic or BCD device 104. The ILD layer 122 may be or comprise, for example, silicon dioxide, a low κ dielectric, silicon nitride, some other suitable dielectric(s), or any combination of the foregoing. As used herein, a low κ dielectric may be, for example, a dielectric with a dielectric constant κ less than about 3.9, 3, 2, or 1. The contact vias 124 may be or comprise, for example, copper, aluminum copper, aluminum, tungsten, some other suitable metal(s), or any combination of the foregoing.

With reference to FIG. 1B, a cross-sectional view 100B of some other embodiments of the IC of FIG. 1A is provided. As illustrated, FIG. 1B is a variant of FIG. 1A in which the dummy dielectric element 120d of FIG. 1A is omitted. In some of such embodiments, the dummy seal element 118d directly contacts the isolation structure 114.

With reference to FIG. 2A, a cross-sectional view 200A of some more detailed embodiments of the IC of FIG. 1A is provided. Section I illustrates some more detailed embodiments of section I of FIG. 1A. Section II' illustrates some more detailed BCD embodiments of section II of FIG. 1A. BCD region 106b of the semiconductor substrate 106 corresponds to the logic or BCD region 106lb of FIG. 1A, BCD device 104b corresponds to the logic or BCD device 104 of FIG. 1A, and one or more BCD wells $110b_1$-$110b_5$ correspond to the logic or BCD well 110 of FIG. 1A. Section II" illustrates some more detailed logic embodiments of section II of FIG. 1A. Logic region 106l of the semiconductor substrate 106 corresponds to the logic or BCD region 106lb of FIG. 1A, logic device 104l corresponds to the logic or BCD device 104 of FIG. 1A, and logic well 110l corresponds to the logic or BCD well 110 of FIG. 1A. While FIG. 2A illustrates both sections II' and II", section II' or II" (but not both) may be omitted in other embodiments.

As illustrated by section II" of FIG. 2A, the logic well 110l is in the logic region 106l of the semiconductor substrate 106. The logic well 110l has as a different doping profile, a different doping concentration, a different doping type, or any combination of the foregoing relative to the bulk 112 of the semiconductor substrate 106. In some embodiments, the logic well 110l has a single doping type. Further, the logic well 110l is surrounded by the isolation structure 114, and the isolation structure 114 comprises a pair of logic segments on opposite sides of the logic well 110l.

The logic device 104l overlies the logic well 110l, on the logic region 106l of the semiconductor substrate 106. The logic device 104l may be, for example, a metal-oxide-semiconductor field-effect transistor (MOSFET), some other suitable metal-oxide-semiconductor (MOS) device, an insulated gate field-effect transistor (IGFET), or some other suitable logic device. In some embodiments, the logic device 104l comprises a pair of logic source/drain regions 222. For ease of illustration, only one of the logic source/drain regions 222 is labeled 222. The logic source/drain regions 222 are respectively on opposite sides of the logic well 110l, recessed into a top surface of the logic well 110l. Further, the logic source/drain regions 222 have the same doping type. In some embodiments, a pair of logic source/drain extensions 222e is also recessed into the top surface of the logic well 110l, laterally between the logic source/drain regions 222. For ease of illustration, only one of the logic source/drain extensions 222e is labeled 222e. The logic source/drain extensions 222e extend respectively from the logic source/drain regions 222, and have the same doping type but a lesser doping concentration than the logic source/drain regions 222.

A selectively-conductive logic channel 224 is between the logic source/drain regions 222. In some embodiments without the logic source/drain extensions 222e, the selectively-conductive logic channel 224 extends continuously from one of the logic source/drain regions 222 to another one of the logic source/drain regions 222. In some embodiments with the logic source/drain extensions 222e, the selectively-conductive logic channel 224 extends continuously from one of the logic source/drain extensions 222e to another one of the logic source/drain extensions 222e. The selectively-conductive logic channel 224 is defined by the logic well 110l, and the logic well 110l has an opposite doping type as the logic source/drain regions 222. For example, the logic source/drain regions 222 may be p-type and the logic well 110l may be n-type, or vice versa.

A logic gate electrode 226 and a logic gate dielectric layer 228 are stacked on the selectively-conductive logic channel 224, and the logic gate electrode 226 overlies the logic gate dielectric layer 228. The logic gate dielectric layer 228 may be or comprise, for example, an oxide, a high κ dielectric, some other suitable dielectric(s), or any combination of the foregoing. The logic gate electrode 226 may be or comprise, for example, doped polysilicon, metal, or some other suitable conductive material.

As illustrated by section II' of FIG. 2A, the BCD well(s) $110b_1$-$110b_5$ is/are in the BCD region 106b of the semiconductor substrate 106. At least some (e.g., all) of the BCD well(s) $110b_1$-$110b_5$ each has a different doping profile, a different doping concentration, a different doping type, or any combination of the foregoing relative to the bulk 112 of the semiconductor substrate 106. Further, in some embodiments, at least some (e.g., all) of the BCD well(s) $110b_1$-$110b_5$ each has a single doping type.

In some embodiments, a first BCD well $110b_1$ and a second BCD well $110b_2$ are in the BCD region 106b of the semiconductor substrate 106, along a top surface of the semiconductor substrate 106. The second BCD well $110b_2$ overlies the first BCD well $110b_1$ and is localized to first side of the first BCD well $110b_1$. The first BCD well $110b_1$ has a first doping type, and the second BCD well $110b_2$ has a second doping type opposite the first doping type. In some embodiments, the bulk 112 of the semiconductor substrate 106 also has the second doping type. The first and second doping types may respectively be, for example, p-type and n-type, or vice versa. Further, in some embodiments, a third BCD well $110b_3$, a fourth BCD well $110b_4$, a fifth BCD well $110b_5$, or any combination of the foregoing are in the BCD region 106b of the semiconductor substrate 106.

In some embodiments, the third BCD well $110b_3$ overlies the first BCD well $110b_1$ and is localized to second side of the first BCD well $110b_1$ opposite the first side of the first BCD well $110b_1$. In some embodiments, the fourth BCD well $110b_4$ underlies the first and second BCD wells $110b_1$, $110b_2$, and further underlies the third BCD well $110b_3$ where present. The third BCD well $110b_3$ has the first doping type, and the fourth BCD well $110b_4$ has the second doping type. In some embodiments, the third BCD well $110b_3$ has a higher doping concentration than the first BCD well $110b_1$. In some embodiments, the fifth BCD well $110b_5$ surrounds the first and second BCD wells $110b_1$, $110b_2$, and further surrounds the third BCD well $110b_3$ where present and/or the fourth BCD well $110b_4$ where present. Further, the fifth BCD well $110b_5$ is along the top surface of the semiconductor substrate 106. The fifth BCD well $110b_5$ comprises a pair of well segments respectively on opposite sides of the first BCD well $110b_1$, such that the first and second BCD wells $110b_1$, $110b_2$ are sandwiched between the well segments. In some embodiments, the third BCD well $110b_3$ and/or the fourth BCD well $110b_4$ is/are also sandwiched between the well segments. The fifth BCD well $110b_5$ has the second doping type.

In some embodiments, a buried semiconductor layer 230 underlies the BCD well(s) $110b_1$-$110b_5$, and/or the isolation structure 114 surrounds and/or separates the BCD well(s) $110b_1$-$110b_5$. In some embodiments, the buried semiconductor layer 230 has the first doping type. In some embodiments, the isolation structure 114 surrounds the first and second BCD wells $110b_1$, $110b_2$, and further surrounds the third BCD well $110b_3$ where present and/or the fourth BCD well $110b_4$ where present. For example, the isolation structure 114 may comprise a trio of BCD segments, only some of which are labeled 114 for ease of illustration. A first BCD segment of the trio and a second BCD segment of the trio may be respectively on opposite sides of the first BCD well $110b_1$. The first BCD segment may separate the second BCD well $110b_2$ from the fifth BCD well $110b_5$, and the second BCD segment may separate the third BCD well $110b_3$ from the fifth BCD well $110b_5$. Further, a third BCD segment of the trio may be between the first and second BCD segments, and may further separate the first BCD well $110b_1$ from the third BCD well $110b_3$.

The BCD device 104b overlies the BCD well(s) $110b_1$-$110b_5$, on the BCD region 106b of the semiconductor substrate 106. The BCD device 104b may be, for example, a laterally diffused MOS (LDMOS) device, some other suitable MOS device, some other suitable DMOS device, a BJT, or some other suitable BCD device. Further, the BCD device 104b may be configured to operate at high voltages greater than about 50, 100, 200, or 500 volts.

In some embodiments, the BCD device 104b comprises a pair of BCD source/drain regions 232. For ease of illustration, only one of the BCD source/drain regions 232 is labeled 232. The BCD source/drain regions 232 overlie the first BCD well $110b_1$, respectively on opposite sides of the first BCD well $110b_1$, and are recessed into a top surface of the semiconductor substrate 106. A first BCD source/drain region of the BCD source/drain regions 232 further overlies the second BCD well $110b_2$, and a second BCD source/drain region of the BCD source/drain regions 232 further overlies the third BCD well $110b_3$ where present. In some embodiments, the first BCD source/drain region also overlies a body well 234 of the semiconductor substrate 106 overlying the second BCD well $110b_2$. The body well 234 has the second doping type and may, for example, have a different doping concentration than the second BCD well $110b_2$. The BCD source/drain regions 232 have the same doping type and further have the first doping type. Further, in some embodiments, a BCD source/drain region extension 232e overlies the second BCD well $110b_2$, as well as the body well 234 where present. The BCD source/drain region extension 232e has the same doping type and a lesser doping concentration than the BCD source/drain regions 232.

A selectively-conductive BCD channel 236 is between the first BCD source/drain region and the first BCD well $110b_1$, and is defined by the second BCD well $110b_2$. In some embodiments without the BCD source/drain region extension 232e, the selectively-conductive BCD channel 236 extends continuously from the first BCD source/drain region to the first BCD well $110b_1$. In some embodiments with the BCD source/drain region extension 232e, the selectively-conductive BCD channel 236 extends continuously from the BCD source/drain region extension 232e to the first BCD well $110b_1$. The first BCD well $110b_1$ and, where present, the third BCD well $110b_3$ serve as a drift region for the BCD device 104b. The drift region provides a conductive path from the selectively-conductive BCD channel 236 to the second BCD source/drain region and, although conductive, has a higher resistance than an ON resistance of the selectively-conductive BCD channel 236 to allow the BCD device 104b to operate at high voltages. The drift region has the first doping type.

A BCD gate electrode 238 and one or more BCD gate dielectric layers 240a-240c are stacked on the selectively-conductive BCD channel 236, and the BCD gate electrode 238 overlies the BCD gate dielectric layer(s) 240a-240c. For example, a first BCD gate dielectric layer 240a overlies a second BCD gate dielectric layer 240b, the second BCD gate dielectric layer 240b overlies a third BCD gate dielectric layer 240c, and the third BCD gate dielectric layer 240c overlies the selectively-conductive BCD channel 236. In some embodiments, the second BCD gate dielectric layer 240b has the second thickness $T_2$ of the dummy dielectric element 120d. The BCD gate dielectric layer(s) 240a-240c may be or comprise, for example, an oxide, a high κ dielectric, some other suitable dielectric(s), or any combination of the foregoing. The BCD gate electrode 238 may be or comprise, for example, doped polysilicon, metal, or some other suitable conductive material.

As illustrated by section I of FIG. 2A, the memory well 108 is in the memory region 106m of the semiconductor substrate 106. The memory well 108 has a different doping profile, a different doping concentration, a different doping type, or any combination of the foregoing relative to the bulk 112 of the semiconductor substrate 106. Further, the memory well 108 is surrounded by the isolation structure 114. In some embodiments, a top surface of the memory well 108 is recessed below a top surface of the logic well 110l, a top surface of the BCD well(s) $110b_1$-$110b_5$, a top surface of the bulk 112 of the semiconductor substrate 106, or any combination of the foregoing by a distance D. The distance D may be, for example, about 10-100 angstroms, about 40-60 angstroms, or about 25-75 angstroms.

The memory cell 102 overlies the memory well 108, on the memory region 106m of the semiconductor substrate 106. In some embodiments, the memory cell 102 comprises a pair of memory source/drain regions 202. For ease of illustration, only one of the memory source/drain regions 202 is labeled 202. The memory source/drain regions 202 are respectively on opposite sides of the memory well 108, recessed into a top surface of the memory well 108. Further, the memory source/drain regions 202 have the same doping type. In some embodiments, a pair of memory source/drain extensions 202e is also recessed into the top surface of the memory well 108, laterally between the memory source/drain regions 202. For ease of illustration, only one of the memory source/drain extensions 202e is labeled 202e. The memory source/drain extensions 202e extend respectively from the memory source/drain regions 202, and have the same doping type but a lesser doping concentration than the memory source/drain regions 202.

A selectively-conductive memory channel 204 is between the memory source/drain regions 202. In some embodiments without the memory source/drain extensions 202e, the selectively-conductive memory channel 204 extends continuously from one of the memory source/drain regions 202 to another one of the memory source/drain regions 202. In some embodiments with the memory source/drain extensions 202e, the selectively-conductive memory channel 204 extends continuously from one of the memory source/drain extensions 202e to another one of the memory source/drain extensions 202e. Further, the selectively-conductive memory channel 204 is defined by the memory well 108, and the memory well 108 has an opposite doping type as the memory source/drain regions 202. For example, the memory source/drain regions 202 may be p-type and the memory well 108 may be n-type, or vice versa.

A floating gate hard mask 206, a floating gate electrode 208, and a floating gate dielectric layer 210 are stacked on the selectively-conductive memory channel 204. The floating gate hard mask 206 overlies the floating gate electrode 208, and the floating gate electrode 208 overlies the floating gate dielectric layer 210. The floating gate hard mask 206 and the floating gate dielectric layer 210 may be or comprise, for example, oxide, some other suitable dielectric(s), or any combination of the foregoing. In some embodiments, the floating gate dielectric layer 210 has a third thickness $T_3$ of about 50-400 angstroms, about 75-125 angstroms, about 50-200 angstroms, or about 200-400 angstroms. In some embodiments, the third thickness $T_3$ is about 1.5-2.5 times the distance D, about 1.75-2.25 times the distance D, about 1.9-2.1 the distance D, or about 2 times the distance D. The floating gate electrode 208 may be or comprise, for example, doped polysilicon or some other suitable conductive material.

A first select gate dielectric layer 214 overlies the selectively-conductive memory channel 204, to sides of the floating gate electrode 208, and comprises a pair of select gate dielectric segments respectively lining opposite sidewalls of the floating gate electrode 208. For ease of illustration, only one of the select gate dielectric segments is labeled 214. Additionally, the select gate dielectric segments line opposite sidewalls of the floating gate dielectric layer 210 that are respectively even with the opposite sidewalls of the floating gate electrode 208, and extend from the opposite sidewalls of the floating gate dielectric layer 210 respectively towards the memory source/drain regions 202. The first select gate dielectric layer 214 may be or comprise, for example, silicon oxide, a high κ dielectric, some other suitable dielectric(s), or any combination of the foregoing.

A select gate electrode 216 overlies the first select gate dielectric layer 214 and the selectively-conductive memory channel 204, and further overlies the floating gate hard mask 206. Further, a memory sidewall spacer 218 and, in some embodiments, a second select gate dielectric layer 220 overlie the first select gate dielectric layer 214, between the first select gate dielectric layer 214 and the select gate electrode 216. The memory sidewall spacer 218 comprises a pair of memory spacer segments respectively lining sidewalls of the first select gate dielectric layer 214 on opposite sides of the floating gate electrode 208. For ease of illustration, only one of the memory sidewall spacer segments is labeled 218. The second select gate dielectric layer 220 further overlies the memory sidewall spacer 218 and the floating gate hard mask 206. The select gate electrode 216 may be or comprise, for example, doped polysilicon, metal, or some other suitable conductive material. The second select gate dielectric layer 220 may be or comprise, for example, silicon oxide, a high κ dielectric, some other suitable dielectric(s), or any combination of the foregoing. The memory sidewall spacer 218 may be or comprise, for example, silicon oxide, silicon nitride, silicon oxynitride, some other suitable dielectric(s), or any combination of the foregoing.

The dummy structure 116 is on the memory region 106m of the semiconductor substrate 106, adjacent to the memory cell 102. The dummy structure 116 is defined by a dummy seal element 118d and, in some embodiments, the dummy dielectric element 120d underlying the dummy seal element 118d. The dummy seal element 118d comprises a pair of dummy seal segments respectively on opposite sides of the memory cell 102. Further, the dummy dielectric element 120d comprises a pair of dummy dielectric segments respectively on the opposite sides of the memory device, and respectively underlying the dummy seal segments. For ease of illustration, only one of the dummy seal segments is labeled 118d, and only one of the dummy dielectric segments is labeled 120d.

Main sidewall spacers 242 line sidewalls of the memory cell 102, the dummy structure 116, the logic device 104l, and the BCD device 104b. For ease of illustration, only some segments of the main sidewall spacers 242 are labeled 242. Further, the ILD layer 122 covers the semiconductor substrate 106, the main sidewall spacers 242, the dummy structure 116, the memory cell 102, the logic device 104l, the BCD device 104b, and the isolation structure 114. Further yet, the contact vias 124 extend through the ILD layer 122 and electrically couple with the memory cell 102, the logic device 104l, and the BCD device 104b. For ease of illustration, only some of the contact vias 124 are labeled 124. The main sidewall spacers 242 may be or comprise, for example, silicon nitride, silicon oxide, silicon oxynitride, some other suitable dielectric(s), or any combination of the foregoing.

Figure 2B:
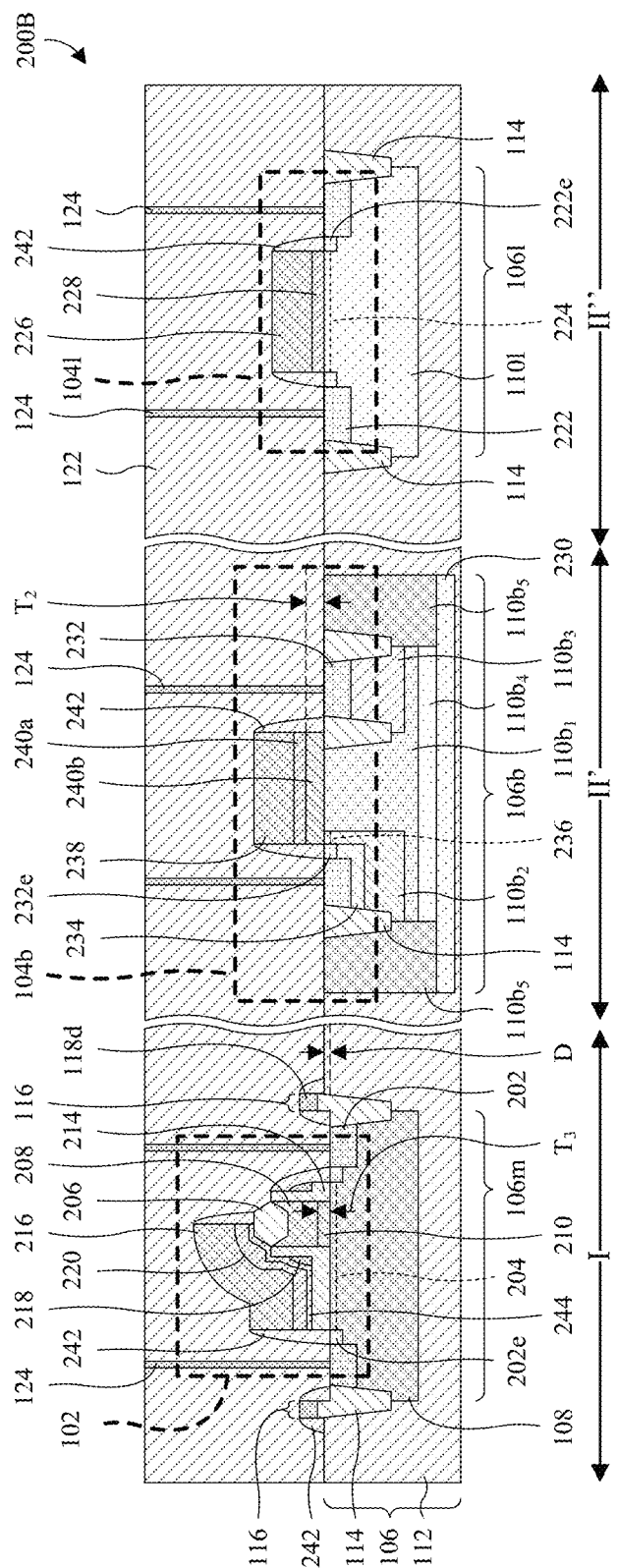

With reference to FIG. 2B, a cross-sectional view 200B of some more detailed embodiments of the IC of FIG. 1B is provided. As illustrated, FIG. 2B is a variant of FIG. 2A in which the dummy dielectric element 120d of FIG. 2A is omitted. In some of such embodiments, the dummy seal element 118d directly contacts the isolation structure 114. Further, a third select gate dielectric layer 244 separates the second select gate dielectric layer 220 from the first select gate dielectric layer 214, and/or the third BCD gate dielectric layer 240c of FIG. 2A is omitted. The third select gate dielectric layer 244 may be or comprise, for example, silicon oxide, some other suitable dielectric(s), or any combination of the foregoing.

With reference to FIGS. 3-23, a series of cross-sectional views 300-2300 of some embodiments of a seal method to form an IC comprising a memory cell and a BCD or logic device is provided. The seal method is illustrated with regard to an ESF1 device, but it is to be understand that the seal method may be applied to other types of memory devices, such as, for example, SONOS devices, MONOS devices, ESF3 devices, or other suitable types of NVM devices. Further, the seal method may, for example, be performed to form the IC of FIG. 2A.

Figure 3:
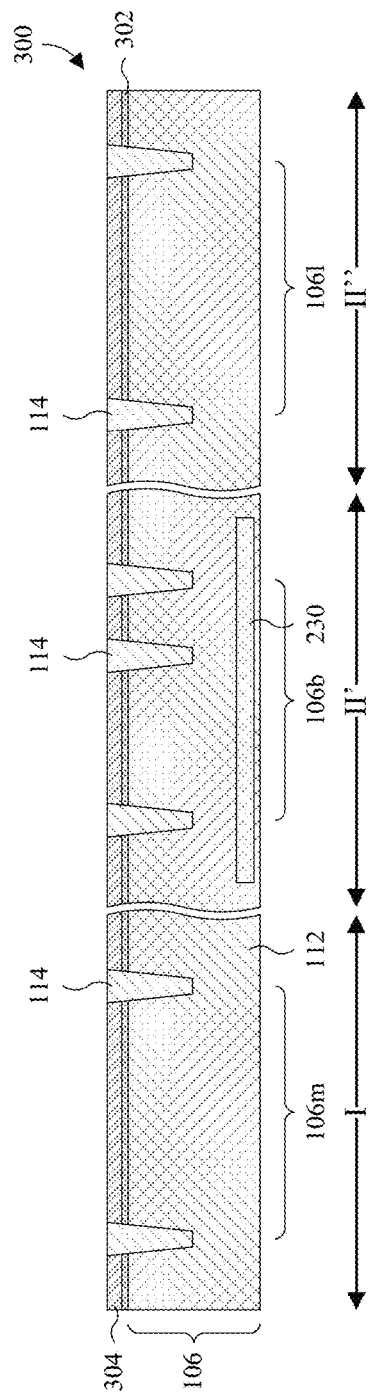

As illustrated by the cross-sectional view 300 of FIG. 3, a semiconductor substrate 106 is provided. The semiconductor substrate 106 comprises a memory region 106m, a BCD region 106b, and a logic region 106l. The memory region 106m is in section I of the IC under manufacture. The BCD region 106b is in section II' of the IC under manufacture. The logic region 106l is in section II" of the IC under manufacture. The semiconductor substrate 106 may be or comprise, for example, a bulk silicon substrate, a silicon epitaxial layer, an SOI substrate, a group III-V semiconductor substrate, some other suitable semiconductor structure(s), or any combination of the foregoing. In some embodiments, a buried semiconductor layer 230 is buried in the semiconductor substrate 106 and localized to the BCD region 106b. Further, in some embodiments, the buried semiconductor layer 230 has a first doping type and a bulk 112 of the semiconductor substrate 106 has a second doping type opposite the first doping type. The first doping type and the second doping type may respectively be n-type and p-type, or vice versa.

Also illustrated by the cross-sectional view 300 of FIG. 3, an isolation structure 114 is formed in the semiconductor substrate 106 to demarcate the memory region 106m of the semiconductor substrate 106, the BCD region 106b of the semiconductor substrate 106, and the logic region 106l of the semiconductor substrate 106. Further, isolation structure 114 electrically insulates the memory region 106m of the semiconductor substrate 106, the BCD region 106b of the semiconductor substrate 106, and the logic region 106l of the semiconductor substrate 106 from surrounding structure, and vice versa. For ease of illustration, only some segments of the isolation structure 114 are labeled 114. The isolation structure 114 may be, for example, a STI structure, a DTI structure, or some other suitable type of isolation structure.

In some embodiments, a process for forming the isolation structure 114 comprises forming a lower pad layer 302 covering the semiconductor substrate 106, and further forming an upper pad layer 304 covering the lower pad layer 302. The lower pad layer 302 may be or comprise, for example, silicon dioxide, some other suitable oxide, or some other suitable dielectric. The upper pad layer 304 may be or comprise, for example, silicon nitride, some other suitable nitride, or some other suitable dielectric. Further, the lower and upper pad layers 302, 304 may be formed by, for example, chemical vapor deposition (CVD), physical vapor deposition (PVD), thermal oxidation, some other suitable growth or deposition process(es), or any combination of the foregoing. As used herein, a term (e.g., process) with a suffix of "(es)" may, for example, be singular or plural. After forming the lower and upper pad layers 302, 304, the lower and upper pad layers 302, 304 are patterned with a layout of the isolation structure 114, and an etch is subsequently performed into the semiconductor substrate 106 with the lower and upper pad layers 302, 304 in place to define a trench with the layout of the isolation structure 114 in the semiconductor substrate 106. A trench dielectric layer is formed covering the upper pad layer 304 and filling the trench. Further, a planarization is performed into the trench dielectric layer until the upper pad layer 304 is reached, thereby forming the isolation structure 114 from the trench dielectric layer. The lower and upper pad layers 302, 304 may, for example, be patterned by a photolithography/etching process or some other suitable patterning process. The trench dielectric layer may, for example, be formed by, for example, CVD, PVD, sputtering, or some other suitable deposition process. The planarization may, for example, be performed by chemical mechanical polish (CMP) or some other suitable planarization process.

Figure 4:
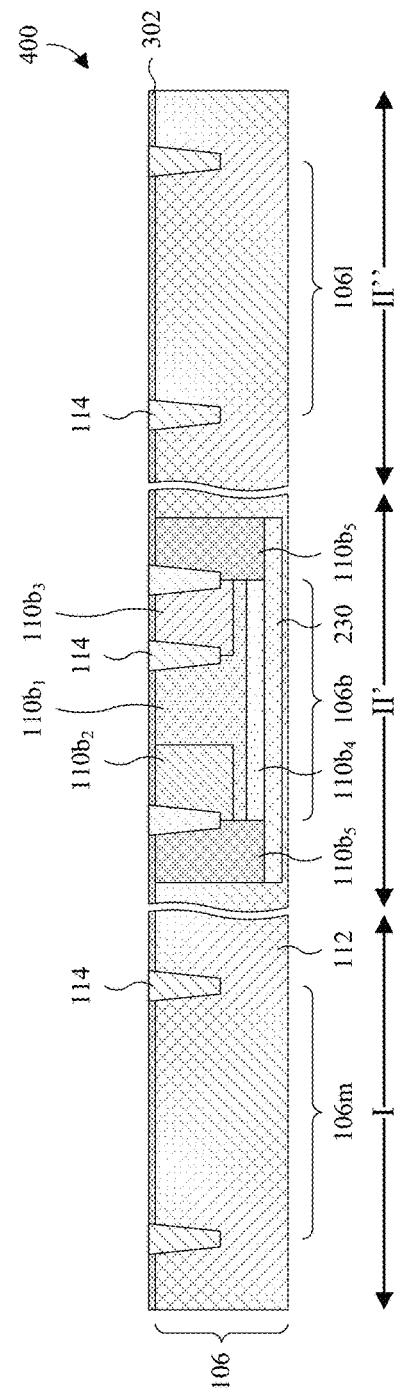

As illustrated by the cross-sectional view 400 of FIG. 4, the upper pad layer 304 (see FIG. 3) is removed from the memory, BCD, and logic regions 106m. 106b, 106l of the semiconductor substrate 106. The removal may, for example, be performed by a planarization, an etching process, or some other suitable removal process. The planarization may, for example, be performed by a CMP or some other suitable planarization process.

Also illustrated by the cross-sectional view 400 of FIG. 4, one or more BCD wells $110b_1$-$110b_5$ is/are formed the BCD region 106b of the semiconductor substrate 106. In some embodiments, a first BCD well $110b_1$ and a second BCD well $110b_2$ are formed in the BCD region 106b of the semiconductor substrate 106, along a top surface of the semiconductor substrate 106. The second BCD well $110b_2$ overlies the first BCD well $110b_1$ and is localized to first side of the first BCD well $110b_1$. The first BCD well $110b_1$ has the first doping type, and the second BCD well $110b_2$ has the second doping type opposite the first doping type. In some embodiments, a third BCD well $110b_3$, a fourth BCD well, and a fifth BCD well are also formed in the BCD region 106b of the semiconductor substrate 106. The third BCD well $110b_3$ overlies the first BCD well $110b_1$ and is along the top surface of the semiconductor substrate 106. Further, the third BCD well $110b_3$ is localized to a second side of the first BCD well $110b_1$, opposite the first side of the first BCD well $110b_1$, and has the first doping type. The fourth BCD well $110b_4$ underlies the first, second, and third BCD wells $110b_1$-$110b_3$ and has the second doping type. The fifth BCD well $110b_5$ surrounds the first, second, third, and fourth BCD wells $110b_1$-$110b_4$ and is along the top surface of the semiconductor substrate 106. Further, the fifth BCD well $110b_5$ comprises a pair of well segments respectively on opposite sides of the first BCD well $110b_1$ and has the second doping type.

In some embodiments, a process for forming the BCD well(s) $110b_1$-$110b_5$ comprises repeatedly performing a selective doping process to sequentially form the BCD well(s) $110b_1$-$110b_5$. In some embodiments, the selective doping process comprises sequentially depositing a photoresist layer on the lower pad layer 302, patterning the photoresist layer with a layout of a BCD well being formed, implanting dopants into the BCD region 106b of the semiconductor substrate 106 with the patterned photoresist layer in place, and removing the patterned photoresist layer. As used herein, the depositing of a photoresist layer may, for example, be performed by spin on coating or some other suitable deposition process. As used herein, the patterning of a photoresist layer may, for example, be performed by a photolithography process or some other suitable patterning process. As used herein, the implanting of the dopants may, for example, be performed by ion implantation or some other suitable doping process. As used herein, the removing of the photoresist layer may, for example, be performed by plasma ashing or some other suitable removal process.

Figure 5:
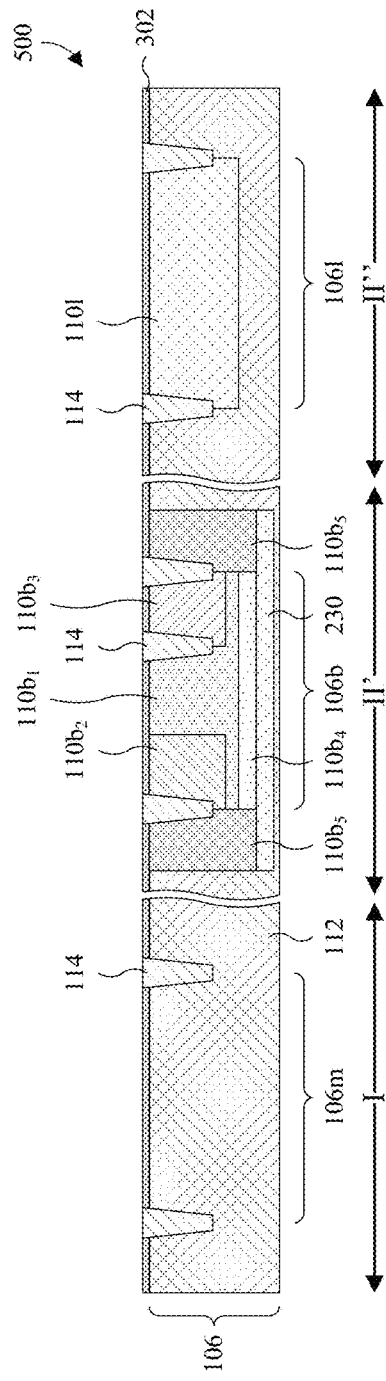

As illustrated by the cross-sectional view 500 of FIG. 5, a logic well 110l is formed in the logic region 106l of the semiconductor substrate 106. In some embodiments, the logic well 110l is formed of an opposite doping type as the bulk 112 of the semiconductor substrate 106. In some embodiments, a process for forming the logic well 110l comprises sequentially depositing a photoresist layer on the lower pad layer 302, patterning the photoresist layer with a layout of the logic well 110l, implanting dopants into the logic region 106l of the semiconductor substrate 106 with the patterned photoresist layer in place, and subsequently removing the patterned photoresist layer. The depositing, the patterning, the implanting, the removing, or any combination of the foregoing may, for example, be as described with regard to FIG. 4.

Figure 6:
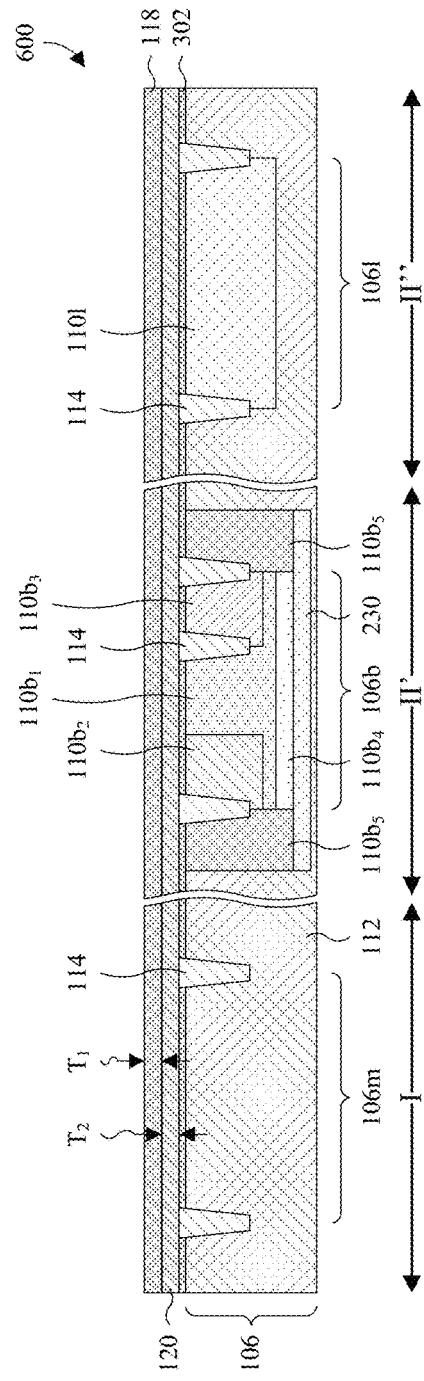

As illustrated by the cross-sectional view 600 of FIG. 6, a first gate dielectric layer 120 is formed covering the memory, BCD, and logic regions 106m, 106b, 106l of the semiconductor substrate 106. Further, a seal layer 118 is formed covering the first gate dielectric layer 120. The first gate dielectric layer 120 may be or comprise, for example, silicon oxide, some other suitable oxide(s), some other suitable dielectric(s), or any combination of the foregoing. The seal layer 118 is a barrier for oxidants used during subsequent processing, and may be or comprise, for example, silicon nitride, silicon oxynitride, silicon carbide, some other suitable dielectric(s), polysilicon (doped or undoped), some other suitable seal material(s), or any combination of the foregoing. In some embodiments, the first gate dielectric layer 120 and the seal layer 118 are formed by CVD, PVD, thermal oxidation, some other suitable deposition process(es), or any combination of the foregoing.

In some embodiments, the seal layer 118 has a first thickness $T_1$ of about 100-500 angstroms, about 100-250 angstroms, about 250-500 angstroms, about 150-350 angstroms, about 50-150 angstroms, or about 450-550 angstroms. In some embodiments, the first gate dielectric layer 120 has a second thickness $T_2$ of about 60-200 angstroms, about 60-130 angstroms, about 130-200 angstroms, about 20-100 angstroms, or about 160-240 angstroms. In some embodiments, the first thickness $T_1$ is about 0.5-8.5 times the second thickness $T_2$, about 0.25-0.75 times the second thickness $T_2$, about 8-9 times the second thickness $T_2$, about 1-5 times the second thickness $T_2$, or about 4-9 times the second thickness $T_2$. In some embodiments, the first thickness $T_1$ is sufficiently large (e.g., greater than about 100 angstroms or some other suitable thickness value) for the seal layer 118 to protect (e.g., completely protect) the logic and BCD regions 106l, 106b from damage by thermal and oxidation processes. Note that this protection is explained hereafter. In some embodiments, the first thickness $T_1$ is sufficiently small (e.g., less than about 500 angstroms or some other suitable thickness value) so the seal layer 118 may be efficiently formed and costs for forming the seal layer 118 may be low.

As illustrated by the cross-sectional view 700 of FIG. 7, the seal layer 118 is patterned to form a first device opening 702 overlying the first gate dielectric layer 120, on the memory region 106m of the semiconductor substrate 106. The patterning of the seal layer 118 may, for example, be performed by a photolithography/etching process or some other suitable patterning process. In some embodiments, the photolithography/etching process comprises depositing a first photoresist layer 704 on the seal layer 118, patterning the first photoresist layer 704 with a pattern of the first device opening 702, performing an etch into the seal layer 118 through the first photoresist layer 704 to transfer the pattern to the seal layer 118, and removing the first photoresist layer 704.

Also illustrated by the cross-sectional view 700 of FIG. 7, a memory well 108 is formed in the memory region 106m of the semiconductor substrate 106. In some embodiments, the memory well 108 is formed with an opposite doping type as the bulk 112 of the semiconductor substrate 106. Further, in some embodiments, a process for forming the memory well 108 comprises ion implantation or some other suitable doping process through the first device opening 702.

As illustrated by the cross-sectional view 800 of FIG. 8, a first etch is performed into the first gate dielectric layer 120 and the lower pad layer 302. The first etch uses the seal layer 118 as a mask, and hence transfers a pattern of the seal layer 118 to the first gate dielectric layer 120 and the lower pad layer 302. Further, the first etch stops on the semiconductor substrate 106, and expands the first device opening 702 to expose the memory well 108.

In some embodiments, although not shown, a B cleaning process is performed after the first etch. In some embodiments, the B cleaning process comprises: applying a sulfuric acid/hydrogen peroxide/deionized water mixture to the first device opening 702; applying a hydrofluoric acid/deionized water mixture to the first device opening 702; applying an ammonium hydroxide/hydrogen peroxide/deionized water mixture to the first device opening 702; and applying a hydrochloric acid/hydrogen peroxide/deionized water mixture to the first device opening 702. The sulfuric acid/hydrogen peroxide/deionized water mixture may, for example, remove organic residues in the first device opening 702. The hydrofluoric acid/deionized water mixture may, for example, remove native oxide in the first device opening 702. The hydrochloric acid/hydrogen peroxide/deionized water mixture may, for example, organic residues and/or particles in the first device opening 702. The sulfuric acid/hydrogen peroxide/deionized water mixture may, for example, remove organic metal ions in the first device opening 702. In some embodiments, the four mixtures are sequentially applied to the first device opening 702 as ordered above.

Figure 9:
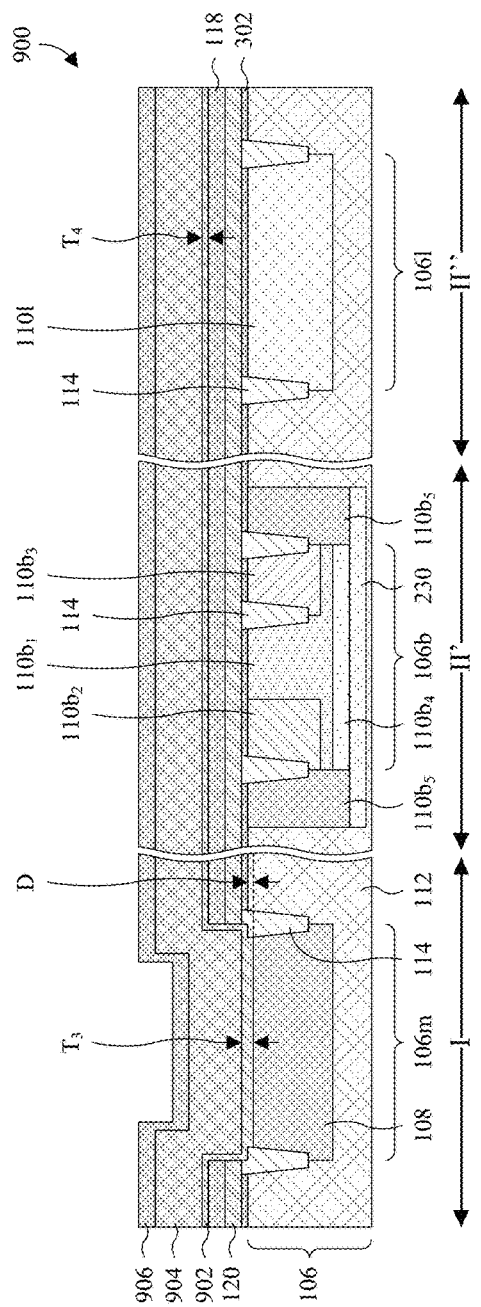

As illustrated by the cross-sectional view 900 of FIG. 9, a second gate dielectric layer 902 is formed covering the memory, BCD, and logic regions 106m, 106b, 106l of the semiconductor substrate 106 over the seal layer 118. Further, the second gate dielectric layer 902 is formed lining the first device opening 702 (see FIG. 8). In some embodiments, the second gate dielectric layer 902 is or comprises silicon dioxide, some other suitable oxide(s), or some other suitable dielectric(s). In some embodiments, the second gate dielectric layer 902 is formed by conformally deposition, and/or is formed by thermal oxidation, CVD, PVD, or some other suitable deposition or growth process.

In some embodiments in which the second gate dielectric layer 902 is formed by thermal oxidation, the memory well 106m is partially consumed by oxidation, such that a top surface of the memory well 106m is recessed by a distance D relative to a top surface the BCD well(s) $110b_1$-$110b_5$, a top surface of the logic well 110l, a top surface of the bulk 112 of the semiconductor substrate 106, or any combination of the foregoing. Absent the seal layer 118, the top surface the BCD well(s) $110b_1$-$110b_5$, the top surface of the logic well 110l, and the top surface of the bulk 112 of the semiconductor substrate 106 would also be recessed since the seal layer 118 prevents the BCD well(s) $110b_1$-$110b_5$, the logic well 110l, and the bulk 112 of the semiconductor substrate 106 from oxidizing during the thermal oxidation. The distance D may be, for example, about 10-100 angstroms, about 40-60 angstroms, or about 25-75 angstroms.

Further, in some embodiments in which the second gate dielectric layer 902 is formed by thermal oxidation, the second gate dielectric layer 902 forms faster on the memory well 106m than on the seal layer 118, such that the second gate dielectric layer 902 has a third thickness $T_3$ on the memory well 106m and a fourth thickness $T_4$ less than the third thickness $T_3$ on the seal layer 118. For example, where the seal layer 118 is silicon nitride and the memory well 106m is monocrystalline silicon, the thermal oxide of the second gate dielectric layer 902 forms slower on the silicon nitride of the seal layer 118 than on the monocrystalline silicon of the memory well 106m. The third thickness $T_3$ may be, for example, about 50-400 angstroms, about 75-125 angstroms, about 50-200 angstroms, or about 200-400 angstroms. Further, the third thickness $T_3$ may be, for example, about 1.5-2.5 times the distance D, about 1.75-2.25 times the distance D, about 1.9-2.1 the distance D, or about 2 times the distance D.

Also illustrated by the cross-sectional view 900 of FIG. 9, a first gate electrode layer 904 is formed covering the second gate dielectric layer 902, and a capping layer 906 is formed covering the first gate electrode layer 904. The first gate electrode layer 904 may be or comprise, for example, doped polysilicon or some other suitable conductive material, and/or the capping layer 906 may be or comprise, for example, silicon nitride, some other suitable nitride, or some other suitable dielectric. In some embodiments, the capping layer 906 is the same material as the seal layer 118. In some embodiments, a process for forming the first gate electrode layer 904 comprises depositing the first gate electrode layer 904, and subsequently doping and annealing the first gate electrode layer 904. The depositing of the first gate electrode layer 904 may, for example, be performed by CVD, PVD, or some other suitable deposition process. The doping of the first gate electrode layer 904 may, for example, performed by ion implantation or some other suitable doping process. The capping layer 906 may, for example, be formed by CVD, PVD, or some other suitable deposition process.

Figure 10:
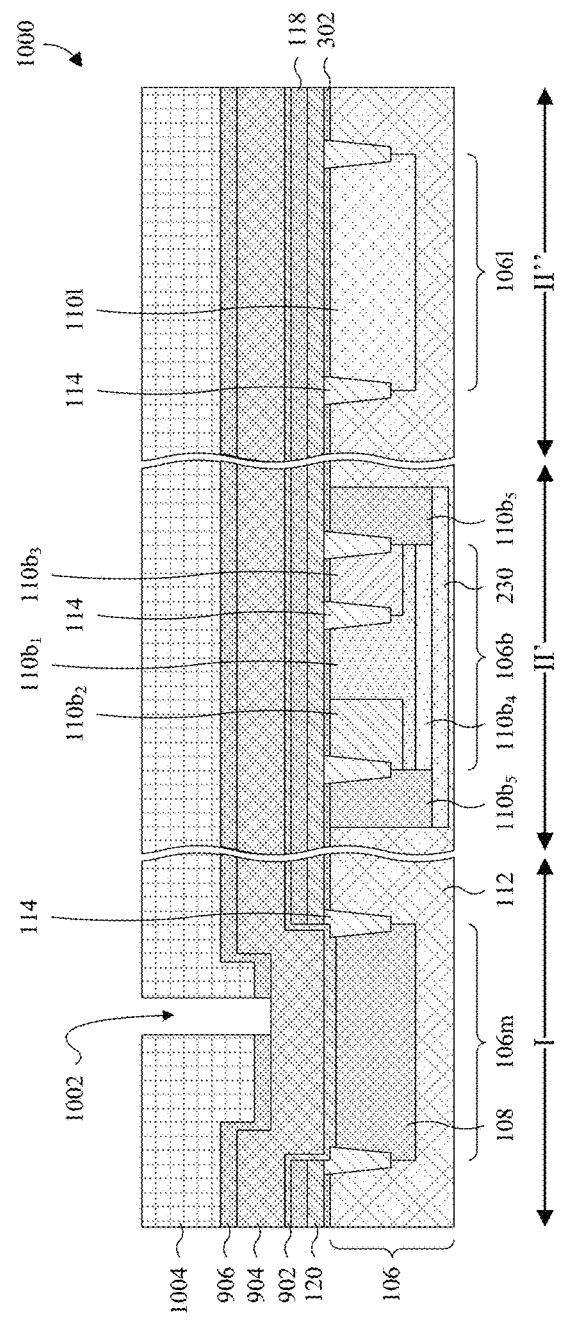

As illustrated by the cross-sectional view 1000 of FIG. 10, the capping layer 906 is patterned to form a hard mask opening 1002 overlying the first gate electrode layer 904, on the memory region 106m of the semiconductor substrate 106. The patterning of the capping layer 906 may, for example, be performed by a photolithography/etching process or some other suitable patterning process. In some embodiments, the photolithography/etching process comprises depositing a second photoresist layer 1004 on the capping layer 906, patterning the second photoresist layer 1004 with a pattern of the hard mask opening 1002, performing an etch into the capping layer 906 through the second photoresist layer 1004 to transfer the pattern to the capping layer 906, and removing the second photoresist layer 1004.

Figure 11:
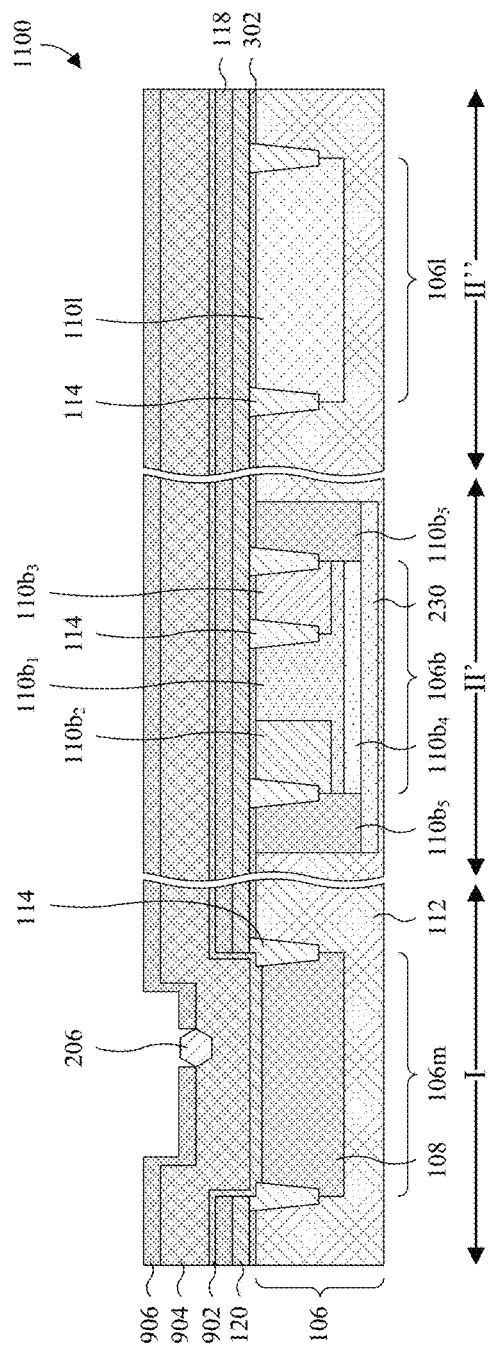

As illustrated by the cross-sectional view 1100 of FIG. 11, a floating gate hard mask 206 is formed in the hard mask opening 1002 (see FIG. 10). The floating gate hard mask 206 may be or comprise, for example, silicon oxide, some other suitable oxide, or some other suitable dielectric. Further, the floating gate hard mask 206 may be or comprise, for example, the same material as the second gate dielectric layer 902. In some embodiments, the floating gate hard mask 206 is formed by thermal oxidation of a portion of the first gate electrode layer 904 in the hard mask opening 1002. In other embodiments, the floating gate hard mask 206 is formed by some other suitable growth or deposition process. Further, in some embodiments, formation of the floating gate hard mask 206 consumes a portion of the floating gate hard mask 206 in the hard mask opening 1002.

Figure 12:
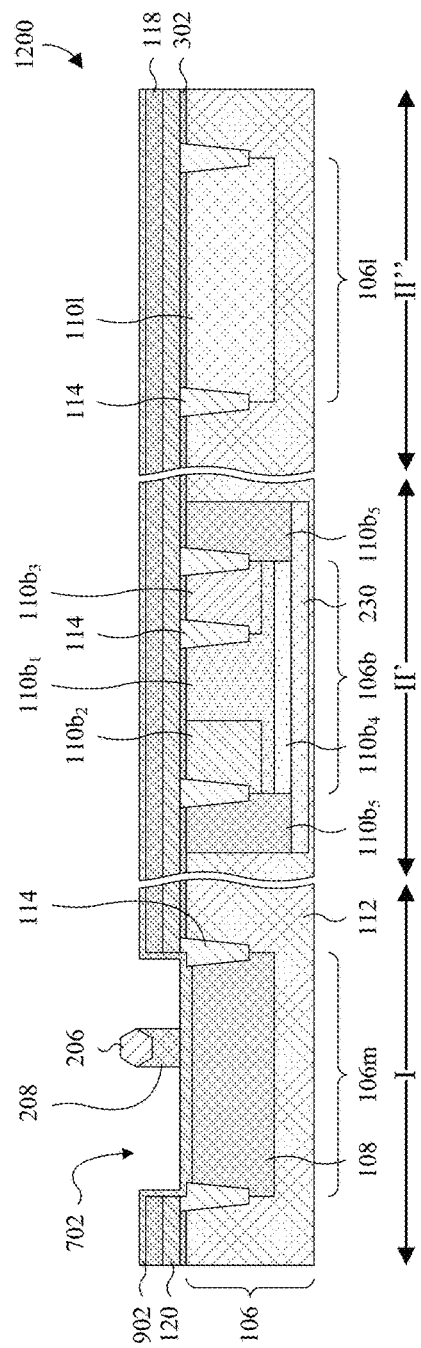

As illustrated by the cross-sectional view 1200 of FIG. 12, a second etch is performed into the capping layer 906 (see FIG. 11) to remove the capping layer 906. In some embodiments, the second etch uses the first gate electrode layer 904 as an etch stop. Further, in some embodiments, an etchant used by the second etch has a etch rate for the capping layer 906 that is higher (e.g., 10, 20, 50, or 100 times greater) than an etch rate for the first gate electrode layer 904 and/or an etch rate for the floating gate hard mask 206.

Also illustrated by the cross-sectional view 1200 of FIG. 12, a third etch is performed into the first gate electrode layer 904 (see FIG. 11) with the floating gate hard mask 206 in place to form a floating gate electrode 208 underlying the floating gate hard mask 206. The third etch may, for example, also partially clear the first device opening 702. In some embodiments, the third etch uses the second gate dielectric layer 902 as an etch stop. Further, in some embodiments, an etchant used by the third etch has a etch rate for the first gate electrode layer 904 that is higher (e.g., 10, 20, 50, or 100 times greater) than an etch rate for the floating gate hard mask 206 and/or an etch rate for the second gate dielectric layer 902.

Figure 13:
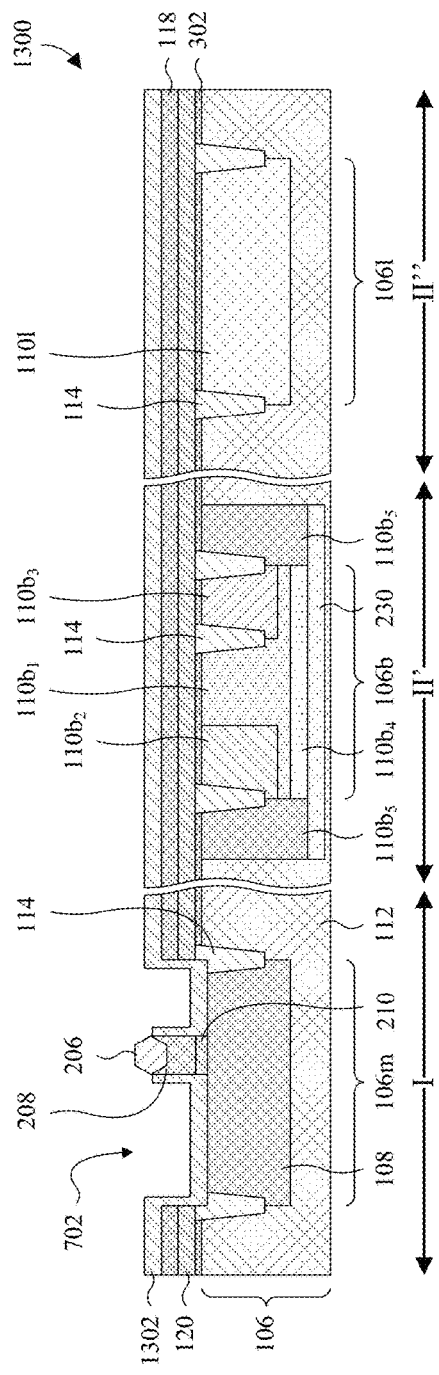

As illustrated by the cross-sectional view 1300 of FIG. 13, a fourth etch is performed into the second gate dielectric layer 902 (see FIG. 12) to form a floating gate dielectric layer 210 underlying the floating gate electrode 208. The fourth etch may, for example, also clear the first device opening 702. The floating gate hard mask 206 and the floating gate electrode 208 serve as a mask for the fourth etch and, in some embodiments, the semiconductor substrate 106 serves as an etch stop for the fourth etch. In some embodiments, the fourth etch is performed as part of a B cleaning process of the first device opening 702. An example of the B cleaning process is described above between the acts of FIG. 8 and the acts of FIG. 9.

Also illustrated by the cross-sectional view 1300 of FIG. 13, a third gate dielectric layer 1302 is formed covering the BCD and logic regions 106b, 106l of the semiconductor substrate 106. Further, the third gate dielectric layer 1302 is formed lining the first device opening 702, and is formed lining sidewalls of the floating gate electrode 208 and sidewalls of the floating gate dielectric layer 210. In some embodiments, the third gate dielectric layer 1302 is or comprises silicon oxide, high temperature oxide (HTO), some other suitable oxide, or some other suitable dielectric. Further, in some embodiments, the third gate dielectric layer 1302 is formed by thermal oxidation or some other suitable deposition process. Where the third gate dielectric layer 1302 is formed by thermal oxidation and the floating gate hard mask 206 is or comprises oxide, the third gate dielectric layer 1302 may, for example, minimally form (if at all) on the floating gate hard mask 206.

Figure 14:
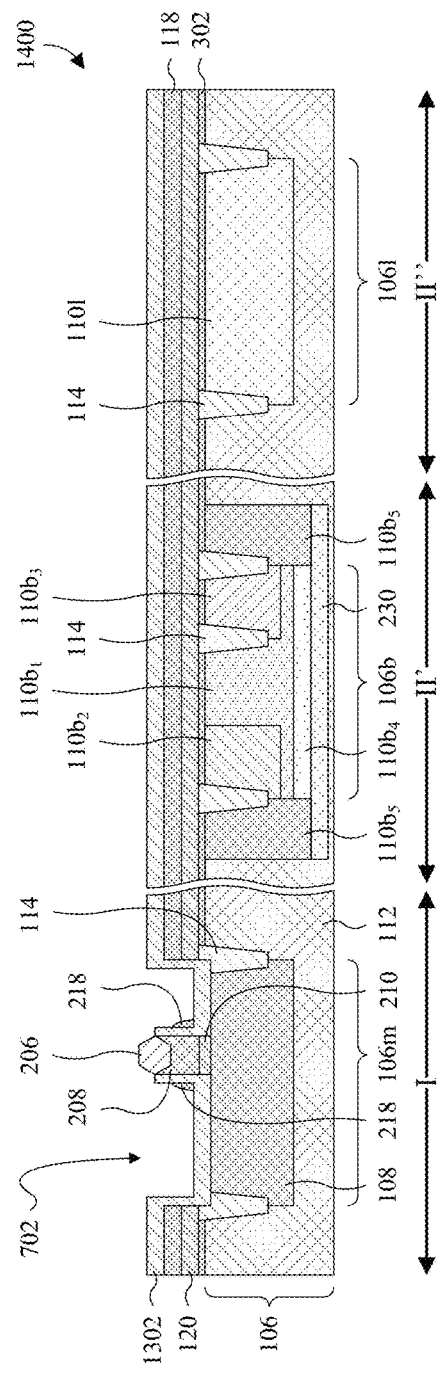

As illustrated by the cross-sectional view 1400 of FIG. 14, a memory sidewall spacer 218 is formed lining floating gate sidewalls of the third gate dielectric layer 1302 that border the floating gate electrode 208, and is further formed overlying the third gate dielectric layer 1302. The memory sidewall spacer 218 comprises a pair of segments respectively on opposite sides of the floating gate electrode 208, and may be or comprise, for example, silicon nitride, silicon oxide, silicon oxynitride, some other suitable dielectric(s), or any combination of the foregoing.

In some embodiments, a process for forming the memory sidewall spacer 218 comprises depositing a memory spacer layer covering the structure of FIG. 13, and subsequently performing an etch back into the memory spacer layer. The etch back removes horizontal segments of the memory spacer layer without removing vertical segments of the memory spacer layer along the floating gate sidewalls of the third gate dielectric layer 1302. These vertical segments define the memory sidewall spacer 218. Further, in some embodiments, the etch back removes vertical segments of the memory spacer layer along other sidewalls of the third gate dielectric layer 1302. This may, for example, be because of a long etch time for the etch back, and because the vertical segments along the floating gate sidewalls of the third gate dielectric layer 1302 have a greater height than the vertical segments along the other sidewalls of the third gate dielectric layer 1302. The depositing may, for example, be performed by conformal deposition, and/or may, for example, be performed by CVD, PVD, some other suitable deposition process(es), or any combination of the foregoing. The third gate dielectric layer 1302 may, for example, serve as an etch stop for the etch back.

Figure 15:
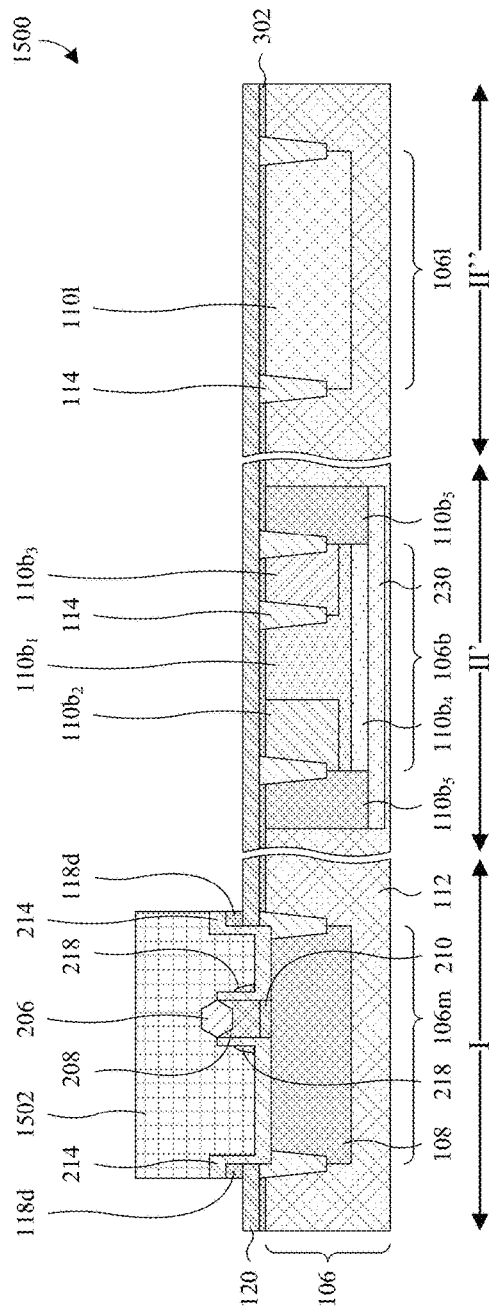

As illustrated by the cross-sectional view 1500 of FIG. 15, the third gate dielectric layer 1302 (see FIG. 14) and the seal layer 118 (see FIG. 14) are patterned to remove the third gate dielectric layer 1302 and the seal layer 118 from the logic and BCD regions 106l, 106b of the semiconductor substrate 106. Further, the patterning forms a first select gate dielectric layer 214 and a dummy seal element 118d on the memory region 106m of the semiconductor substrate 106. The patterning may, for example, be performed by a photolithography/etching process or some other suitable patterning process. In some embodiments, the photolithography/etching process comprises depositing a third photoresist layer 1502 on the third gate dielectric layer 1302, patterning the third photoresist layer 1502 with a pattern of the first select gate dielectric layer 214, performing an etch into the third gate dielectric layer 1302 and the seal layer 118 with the third photoresist layer 1502 in place to transfer the pattern to the third gate dielectric layer 1302 and the seal layer 118, and removing the third photoresist layer 1502. The etch may, for example, be a plasma etch or some other suitable etch.

During the acts of FIGS. 7-14, thermal and oxidation processes may be performed. The thermal and oxidation processes may include, for example, thermal oxidation to form the second gate dielectric layer 902 (see FIG. 9), thermal oxidation to form the floating gate hard mask 206 (see FIG. 11), thermal oxidation to form the third gate dielectric layer 1302 (see FIG. 13), annealing to the first gate electrode layer 904 (see FIG. 9), other suitable thermal and/or oxidation processes, or any combination of the foregoing. Further, at least some of the thermal and oxidation processes may, for example, be performed at high temperatures between about 800-1200 degrees Celsius (° C.), between about 900-1000° C., or between about 700-900° C. The seal layer 118 (see FIGS. 7-14) protects the logic and BCD regions 106l, 106b of the semiconductor substrate 106 from damage by the thermal and oxidation processes. For example, the seal layer 118 may block oxidants used during the thermal and oxidation processes from migrating to the logic and BCD regions 106l, 106b of the semiconductor substrate 106. Absent the seal layer 118, the oxidants would cause oxidation and consumption of the logic and BCD regions 106l, 106b of the semiconductor substrate 106, which shallows the logic well 110l and the BCD well(s) 110b₁-110b₅ and, hence, changes doping profiles respectively of the logic well 110l and the BCD well(s) 110b₁-110b₅. Such changes to the doping profiles, in turn, lead to low yields and changes operating parameters of logic and BCD devices under manufacture on the logic well 110l and the BCD well(s) 110b₁-110b₅. Therefore, the seal layer 118 also leads to high yields and prevent shifts in parameters of the logic and BCD devices under manufacture.

Figure 16:
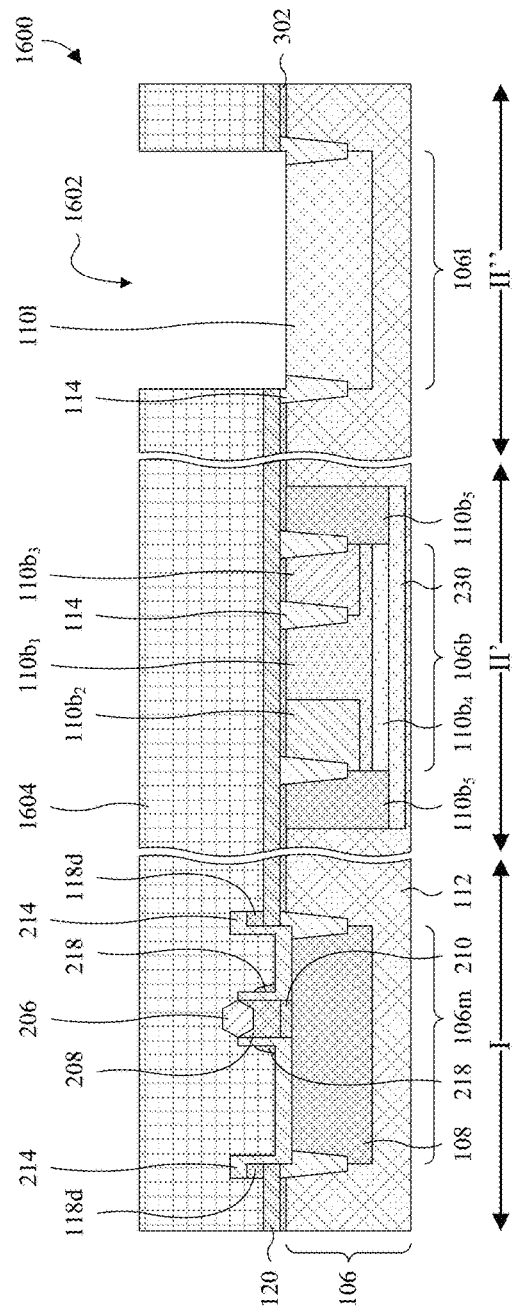

As illustrated by the cross-sectional view 1600 of FIG. 16, the first gate dielectric layer 120 and the lower pad layer 302 are patterned to form a second device opening 1602 overlying and exposing the logic well 110l. The patterning of the first gate dielectric layer 120 and the lower pad layer 302 may, for example, be performed by a photolithography/etching process or some other suitable patterning process. In some embodiments, the photolithography/etching process comprises depositing a fourth photoresist layer 1604 on the first gate dielectric layer 120, patterning the fourth photoresist layer 1604 with a pattern of the second device opening 1602, performing an etch into the first gate dielectric layer 120 and the lower pad layer 302 through the fourth photoresist layer 1604 to transfer the pattern to the first gate dielectric layer 120 and the lower pad layer 302, and removing the fourth photoresist layer 1604.

Figure 17:
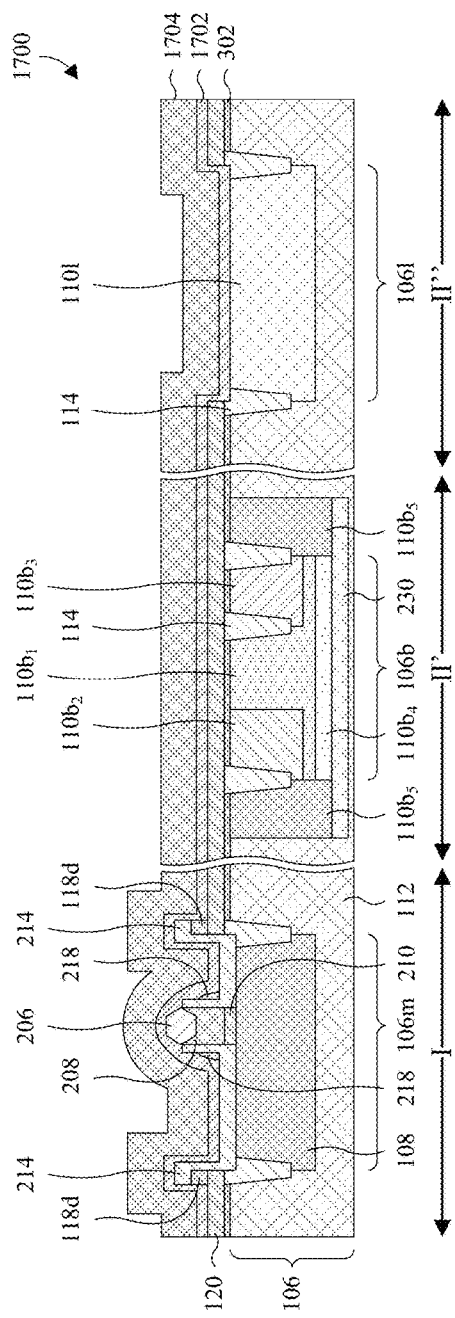

As illustrated by the cross-sectional view 1700 of FIG. 17, a fourth gate dielectric layer 1702 is formed covering the memory, BCD, and logic regions 106m, 106b, 106l of semiconductor substrate 106, and further lining the second device opening 1602 (see FIG. 16). In some embodiments, the fourth gate dielectric layer 1702 is or comprises oxide, some other suitable oxide(s), a high κ dielectric, some other suitable dielectric(s), or any combination of the foregoing. Further, in some embodiments, the fourth gate dielectric layer 1702 is formed by CVD, PVD, or some other suitable deposition process.

Also illustrated by the cross-sectional view 1700 of FIG. 17, a second gate electrode layer 1704 is formed covering the fourth gate dielectric layer 1702. The second gate electrode layer 1704 may be or comprise, for example, doped polysilicon, metal, or some other suitable conductive material. In some embodiments, a process for forming the second gate electrode layer 1704 comprises depositing the second gate electrode layer 1704 by, for example, CVD, PVD, electroless plating, electroplating, or some other suitable deposition or plating process. Further, in some embodiments where the second gate electrode layer 1704 is or comprises polysilicon, dopants are added to the second gate electrode layer 1704. The dopants may be added to the second gate electrode layer 1704 by ion implantation or some other suitable doping process.

Figure 18:
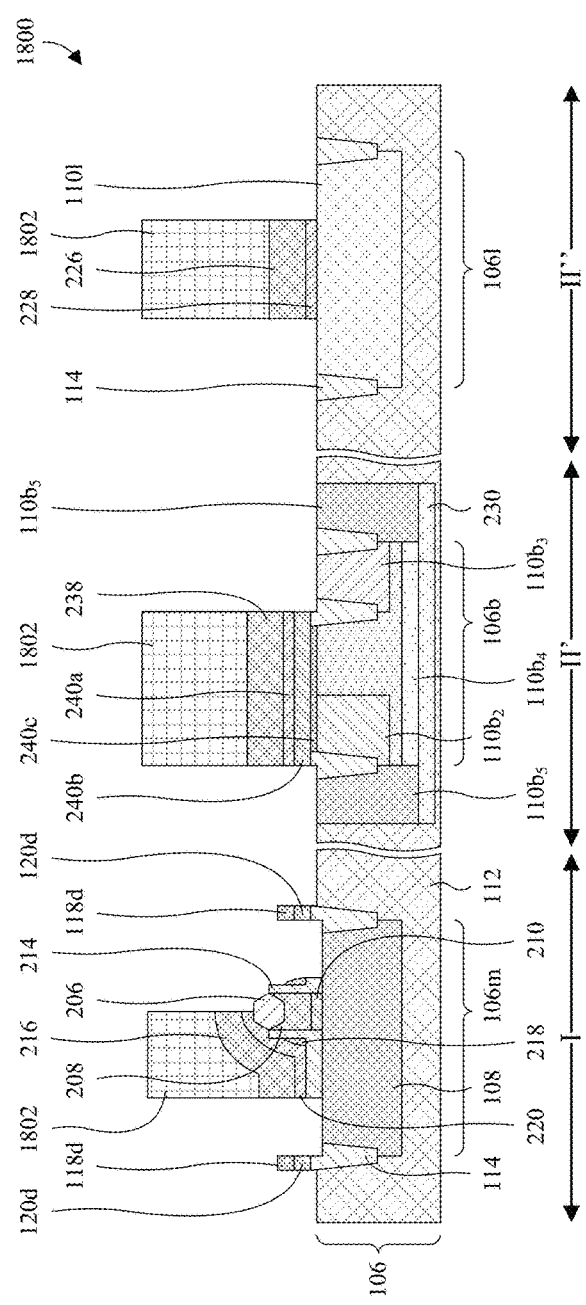

As illustrated by the cross-sectional view 1800 of FIG. 18, the second gate electrode layer 1704 (see FIG. 17), the fourth gate dielectric layer 1702 (see FIG. 17), the first gate dielectric layer 120 (see FIG. 17), the lower pad layer 302 (see FIG. 17), and the first select gate dielectric layer 214 are patterned. The patterning forms a logic gate electrode 226 and a logic gate dielectric layer 228 stacked on the logic well 110l, such that the logic gate electrode 226 overlies the logic gate dielectric layer 228. The logic gate electrode 226 may, for example, be formed from the second gate electrode layer 1704, and/or the logic gate dielectric layer 228 may, for example, be formed from the fourth gate dielectric layer 1702. Further, the patterning forms a BCD gate electrode 238 and a plurality of BCD gate dielectric layers 240a-240c stacked on the BCD well(s) 110b₁-110b₅. A first BCD gate dielectric layer 240a underlies the BCD gate electrode 238 and may, for example, be formed from the fourth gate dielectric layer 1702. A second BCD gate dielectric layer 240b underlies the first BCD gate dielectric layer 240a and may, for example, be formed from the first gate dielectric layer 120. A third BCD gate dielectric layer 240c underlies the second BCD gate dielectric layer 240b and may, for example, be formed from the lower pad layer 302. Further, the patterning forms a select gate electrode 216 and a second select gate dielectric layer 220 stacked upon one another and overlying the first select gate dielectric layer 214, the memory sidewall spacer 218, and the floating gate hard mask 206. The second select gate electrode 216 overlies the second select gate dielectric layer 220 and may, for example, formed from the second gate electrode layer 1704. The second select gate dielectric layer 220 may, for example, be formed from the fourth gate dielectric layer 1702. Further, the patterning forms a dummy dielectric element 120*d* underlying the dummy seal element 118*d* and comprising a pair of dummy dielectric segments respectively on opposite sides of the memory well 108. The dummy dielectric element 120*d* may, for example, be formed from the first gate dielectric layer 120.

The patterning may, for example, be performed by a photolithography/etching process or some other suitable patterning process. In some embodiments, the photolithography/etching process comprises: depositing a fifth photoresist layer 1802 on the second gate electrode layer 1704; patterning the fifth photoresist layer 1802 with a pattern; performing an etch into the second gate electrode layer 1704, the fourth gate dielectric layer 1702, the first gate dielectric layer 120, the lower pad layer 302, and the first select gate dielectric layer 214 with the fifth photoresist layer 1802 in place to transfer the pattern to the second gate electrode layer 1704, the fourth gate dielectric layer 1702, the first gate dielectric layer 120, the lower pad layer 302, and the first select gate dielectric layer 214; and removing the fifth photoresist layer 1802. In some embodiments, the dummy seal element 118*d* serves also serves as a hard mask while performing the etch.

Figure 19:
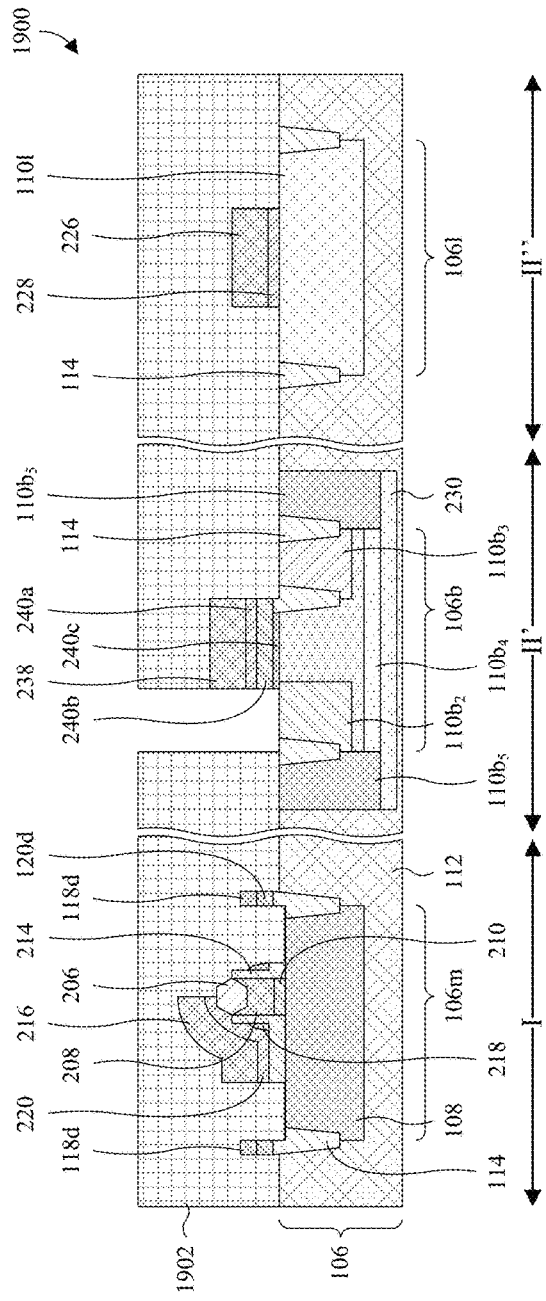

As illustrated by the cross-sectional view 1900 of FIG. 19, the BCD gate electrode 238 and the plurality of BCD gate dielectric layers 240*a*-240*c* are patterned. The patterning uncovers a first portion of the second BCD well 110*b*$_2$ on a first side of the second BCD well 110*b*$_2$, while leaving a second portion of the second BCD well 110*b*$_2$ on a second side of the second BCD well 110*b*$_2$, opposite the first side, covered by the BCD gate electrode 238. The patterning may, for example, be performed by a photolithography/etching process or some other suitable patterning process. In some embodiments, the photolithography/etching process comprises depositing a sixth photoresist layer 1902 on the structure of FIG. 18, patterning the sixth photoresist layer 1902 with a pattern, performing an etch into the BCD gate electrode 238 and the plurality of BCD gate dielectric layers 240*a*-240*c* with the sixth photoresist layer 1902 in place to transfer the pattern to the BCD gate electrode 238 and the plurality of BCD gate dielectric layers 240*a*-240*c*, and removing the sixth photoresist layer 1902.

Also illustrated by the cross-sectional view 1900 of FIG. 19, a body well 234 is formed overlying the second BCD well 110*b*$_2$, on the first side of the second BCD well 110*b*$_2$. In some embodiments, the body well 234 is formed with the same doping type and a different doping concentration than the second BCD well 110*b*$_2$. Further, in some embodiments, the body well 234 is formed by a selective doping process or some other suitable doping process. In some embodiments, the selective doping process comprises implanting dopants into the semiconductor substrate 106 through the sixth photoresist layer 1902. The implanting of the dopants may, for example, be performed by ion implantation or some other suitable doping process.

Figure 20:
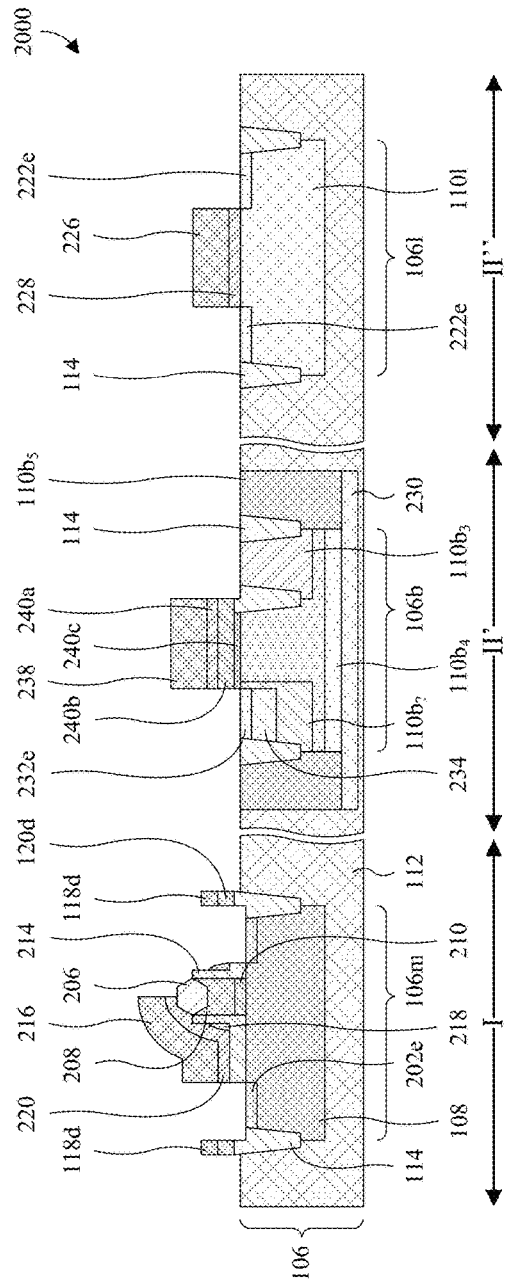

As illustrated by the cross-sectional view 2000 of FIG. 20, a pair of memory source/drain extensions 202*e*, a BCD source/drain extension 232*e*, and a pair of logic source/drain extensions 222*e* are formed respectively overlying the memory well 108, the body well 234, and the logic well 110*l*. For ease of illustration, only one of the memory source/drain extensions 202*e* is labeled 202*e*. The memory source/drain extensions 202*e* are respectively on opposite sides of the memory well 108, such that the select and floating gate electrodes 216, 208 are sandwiched between the memory source/drain extensions 202*e*. The memory source/drain extensions 202*e* may, for example, have an opposite doping type as the memory well 108. The BCD source/drain extension 232*e* may, for example, have the same doping type as the first BCD well 110*b*$_1$. The logic source/drain extensions 222*e* are respectively on opposite sides of the logic well 110*l*, such that the logic gate electrode 226 is sandwiched between the logic source/drain extensions 222*e*. The logic source/drain extensions 222*e* may, for example, have an opposite doping type as the logic well 110*l*.

In some embodiments, a process for forming the memory source/drain extensions 202*e*, the BCD source/drain extension 232*e*, and the logic source/drain extensions 222*e* comprises repeatedly performing a selective doping process. For example, a first selective doping process may be performed to form the memory source/drain extensions 202*e*, which is followed by a second selective doping process to form the logic source/drain extensions 222*e*, which is followed by a third selective doping process to form the BCD source/drain extension 232*e*. In some embodiments, the selective doping process comprises depositing a photoresist layer on the structure of FIG. 19, patterning the photoresist layer with a layout of source/drain extensions being formed, implanting dopants into the semiconductor substrate 106 with the patterned photoresist layer in place, and removing the patterned photoresist layer.

As illustrated by the cross-sectional view 2100 of FIG. 21, main sidewall spacers 242 are formed on sidewalls of the structure in FIG. 20. For ease of illustration, only some of the main sidewall spacers 242 are labeled 242. The main sidewall spacers 242 may be or comprise, for example, silicon nitride, some other suitable nitride(s), some other suitable dielectric(s), or any combination of the foregoing. In some embodiments, a process for forming the main sidewall spacers 242 comprises depositing a main spacer layer covering the structure of FIG. 20, and subsequently performing an etch back into the main spacer layer. The etch back removes horizontal segments of the main spacer layer without removing vertical segments of the main spacer layer, and the remaining vertical segments define the main sidewall spacers 242. The depositing may, for example, be performed by conformal deposition, and/or may, for example, be performed by CVD, PVD, some other suitable deposition process(es), or any combination of the foregoing.

As illustrated by the cross-sectional view 2200 of FIG. 22, a pair of memory source/drain regions 202, a pair of BCD source/drain regions 232, and a pair of logic source/drain regions 222 are formed respectively overlying the memory well 108, the first BCD well 110*b*$_1$, and the logic well 110*l*. The memory source/drain regions 202 are respectively on opposite sides of the memory well 108, such that the select and floating gate electrodes 216, 208 are sandwiched between the memory source/drain regions 202. Further, the memory source/drain regions 202 respectively border the memory source/drain extensions 202*e*, and the memory source/drain regions 202 have the same doping type and a higher doping concentration than the memory source/drain extensions 202*e*. The BCD source/drain regions 232 are respectively on opposite sides of the first BCD well 110*b*$_1$, such that the BCD gate electrode 238 is sandwiched between the BCD source/drain regions 232. Further, one of the BCD source/drain regions 232 borders the BCD source/drain extension 232*e*, and the one of the BCD source/drain regions 232 has the same doping type and a higher doping concentration than the BCD source/drain extensions 232*e*. The logic source/drain regions 222 are respectively on opposite sides of the logic well 110*l*, such that the logic gate electrode 226 is sandwiched between the logic source/drain regions 222. Further, the logic source/drain regions 222 respectively border the logic source/drain extensions 222e, and the memory source/drain regions 202 have the same doping type and a higher doping concentration than the memory source/drain extensions 202e.

In some embodiments, a process for forming the memory source/drain regions 202, the BCD source/drain regions 232, and the logic source/drain regions 222 comprises repeatedly performing a selective doping process. For example, a first selective doping process may be performed to form the memory source/drain regions 202, which is followed by a second selective doping process to form the logic source/drain regions 222, which is followed by a third selective doping process to form the BCD source/drain regions 232. In some embodiments, the selective doping process comprises depositing a photoresist layer on the structure of FIG. 21, patterning the photoresist layer with a layout of source/drain regions being formed, implanting dopants into the semiconductor substrate 106 with the patterned photoresist layer in place, and removing the patterned photoresist layer.

Figure 23:
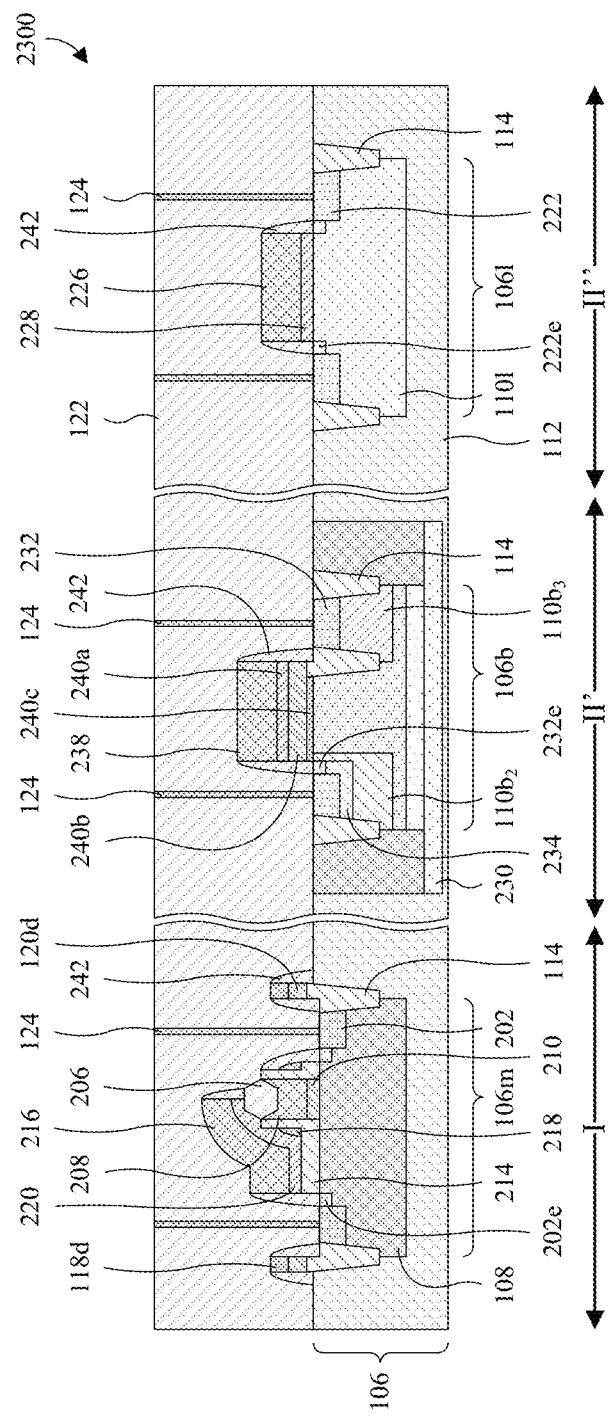

As illustrated by the cross-sectional view 2300 of FIG. 23, an ILD layer 122 is formed covering the structure of FIG. 22, and contact vias 124 are formed extending through the ILD layer 122 to the memory source/drain regions 202, the BCD source/drain regions 232, the logic source/drain regions 222, the select gate electrode 216, the BCD gate electrode 238, the logic gate electrode 226, or any combination of the foregoing. The ILD layer 122 may be or comprise, for example, silicon dioxide, silicon nitride, some other suitable dielectric(s), or any combination of the foregoing. Further, the ILD layer 122 may, for example, be formed by depositing the ILD layer 122 and performing a planarization into a top of the ILD layer 122. The deposition may, for example, be performed by CVD, PVD, or some other suitable deposition process. The planarization may, for example, be performed by a CMP or some other suitable planarization process. The contact vias 124 may be or comprise, for example, tungsten, copper, aluminum copper, aluminum, some other suitable metal(s), or some other suitable conductive material(s). Further, the contact vias 124 may, for example, be formed by a single or dual damascene process.

While not shown, in some embodiments, silicide pads are formed on the memory source/drain regions 202, the BCD source/drain regions 232, and the logic source/drain regions 222 before forming the ILD layer 122. The silicide pads reducing contact resistance between the source/drain regions on the contact vias 124 and may be or comprise, for example, nickel silicide or some other suitable silicide.

Figure 24:
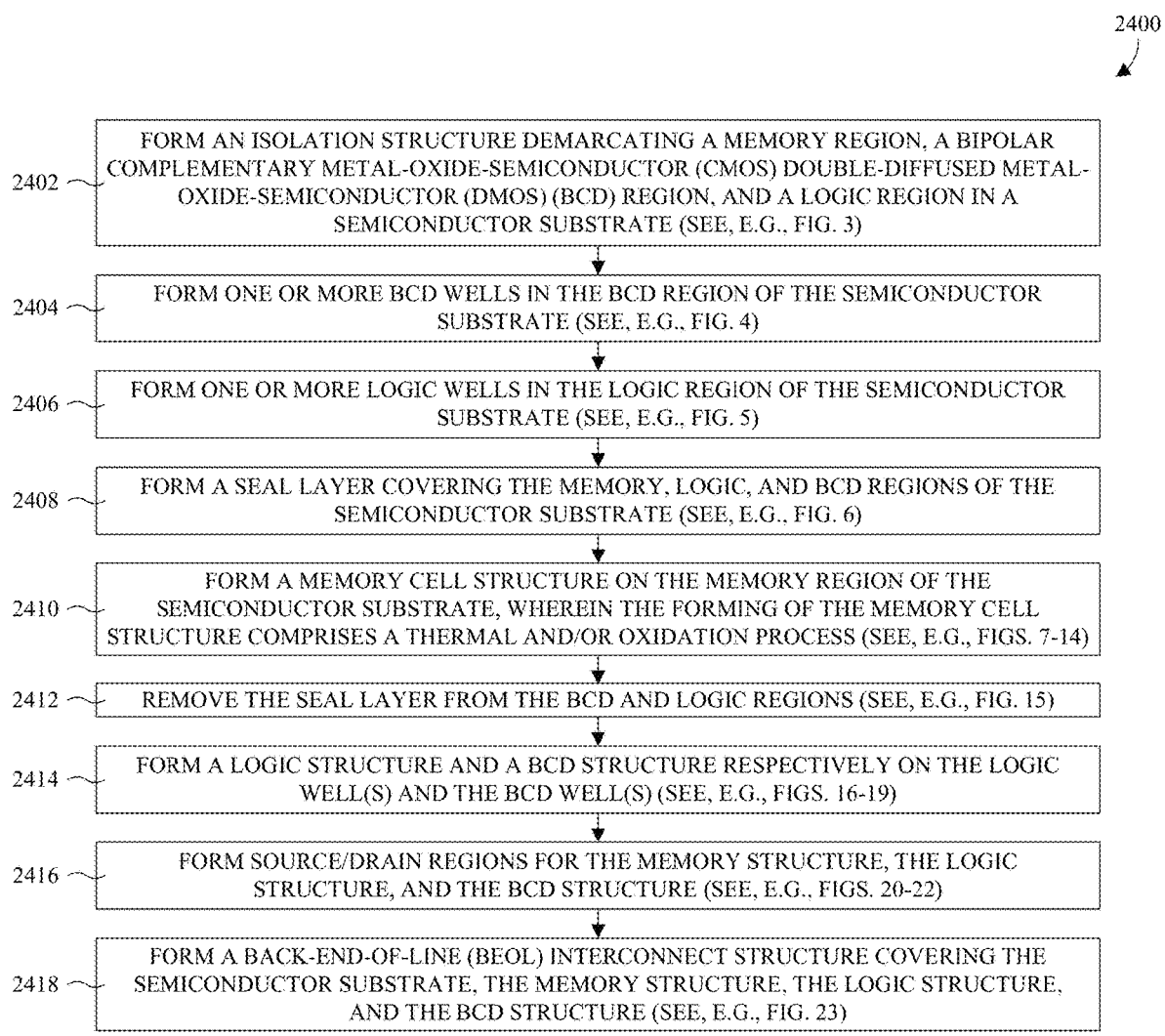
FIG. 24 illustrates a flowchart of some embodiments of the seal method of FIGS. 3-23.

With reference to FIG. 24, a flowchart 2400 of some embodiments of the seal method of FIGS. 3-23 is provided.

At 2402, an isolation structure demarcating a memory region, a BCD region, and a logic region in a semiconductor substrate is formed. See, for example, FIG. 3.

At 2404, one or more BCD wells is/are formed in the BCD region of the semiconductor substrate. See, for example, FIG. 4.

At 2406, one or more logic wells is/are formed in the logic region of the semiconductor substrate. See, for example, FIG. 5.

At 2408, a seal layer is formed covering the memory, logic, and BCD regions of the semiconductor substrate. See, for example, FIG. 6. In some embodiments, the seal layer is or comprises silicon nitride or some other suitable dielectric. Further, in some embodiments, the seal layer is a barrier for oxidants used hereafter at 2410.

At 2410, a memory cell structure is formed on the memory region of the semiconductor substrate. The forming of the memory cell structure comprises a thermal and/or oxidation process. See, for example, FIGS. 7-14.

At 2412, the seal layer is removed from the BCD and logic regions. See, for example, FIG. 15. The seal layer protects the logic and BCD wells from the thermal and/or oxidation process used to form the memory cell structure at 2410. For example, the seal layer prevents oxidants used during the thermal and/or oxidation process at 2410 from oxidizing the logic and BCD wells, thereby reducing depths of the logic and BCD wells and, hence, changing doping profiles the logic and BCD wells. Accordingly, the seal layer leads to high yields, as well as stable/uniform device parameters for logic and BCD devices on the logic and BCD wells.

At 2414, a logic structure and a BCD structure respectively on the logic well(s) and the BCD well(s). See, for example, FIGS. 16-19. In some embodiments, a memory gate electrode (e.g., a select gate electrode) is formed along a sidewall of the memory structure while forming the logic and BCD structures.

At 2416, source/drain regions are formed for the memory structure, the logic structure, and the BCD structure. See, for example, FIGS. 20-22.

At 2418, a back-end-of-line (BEOL) interconnect structure is formed covering the semiconductor substrate, the memory structure, the logic structure, and the BCD structure. See, for example, FIG. 23. The BEOL interconnect structure comprises an ILD layer, as well as contact vias extending through the ILD layer to the source/drain regions.

While the flowchart 2400 of FIG. 24 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

With reference to FIGS. 25-32, a series of cross-sectional views 2500-3200 of some other embodiments of the seal method of FIGS. 3-23 is provided. As seen hereafter, in contrast with the seal method embodiments of FIGS. 3-23, the first gate dielectric layer 120 is formed after the seal layer 118 in the seal method embodiments of FIGS. 25-32. The seal method embodiments of FIGS. 25-32 may, for example, be performed to form the IC of FIG. 2B.

Figure 25:
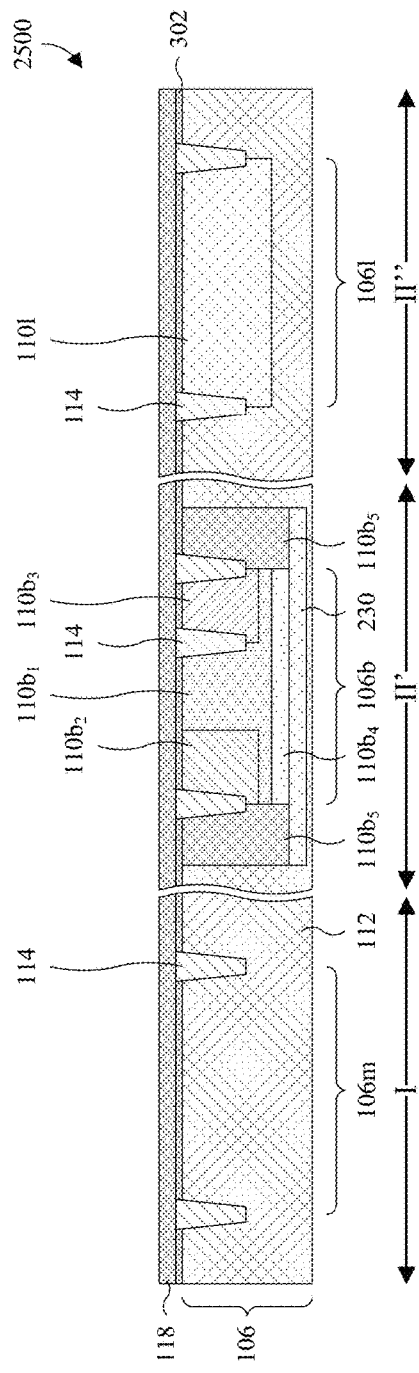
FIGS. 25-32 illustrate a series of cross-sectional views of some other embodiments of the seal method of FIGS. 3-23.

As illustrated by the cross-sectional view 2500 of FIG. 25, an isolation structure 114 is formed in the semiconductor substrate 106 to demarcate a memory region 106m of the semiconductor substrate 106, a BCD region 106b of the semiconductor substrate 106, and a logic region 106l of the semiconductor substrate 106. Further, one or more BCD wells $110b_1$-$110b_5$ is/are formed in the BCD region 106b of the semiconductor substrate 106, and a logic well 110l is formed in the logic region 106l of the semiconductor substrate 106. The isolation structure 114, the BCD wells $110b_1$-$110b_5$, and the logic well 110l may, for example, be formed as described with regard to FIGS. 3-5.

Also illustrated by the cross-sectional view 2500 of FIG. 25, a seal layer 118 is formed covering the memory, BCD, and logic regions 106m, 106b, 106l of the semiconductor substrate 106. The seal layer 118 may, for example, be formed as described with regard to FIG. 6. In contrast with FIG. 6, the first gate dielectric layer 120 of FIG. 6 is omitted.

Figure 26:
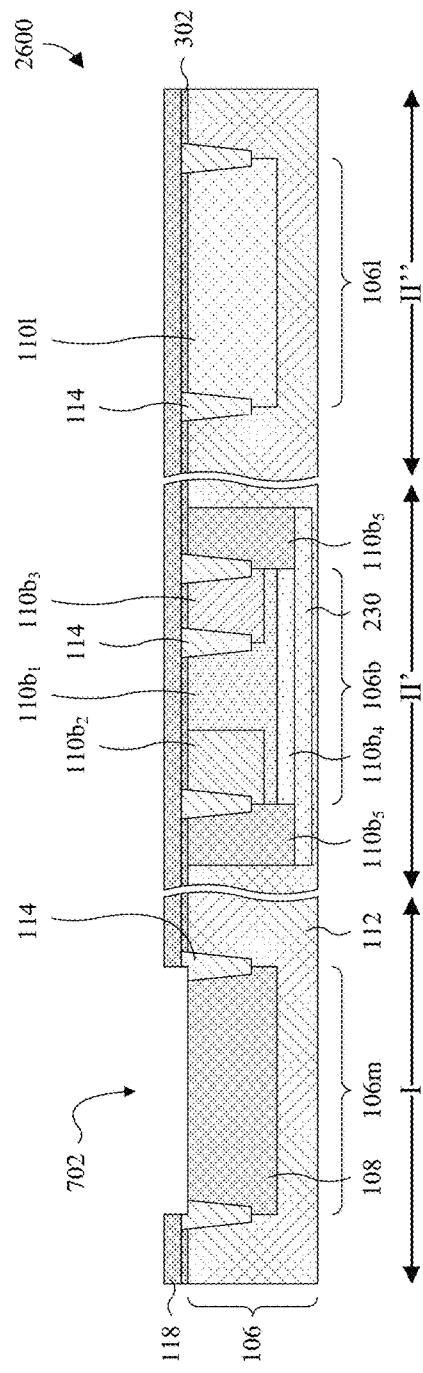

As illustrated by the cross-sectional view 2600 of FIG. 26, the seal layer 118 and a lower pad layer 302 are patterned to form a first device opening 702 on the memory region 106m of the semiconductor substrate 106. Further, a memory well 108 is formed in the memory region 106m of the semiconductor substrate 106 through the first device opening 702. The patterning and the forming of the memory well 108 may, for example, be performed as described with regard to FIGS. 7 and 8.

Figure 27:
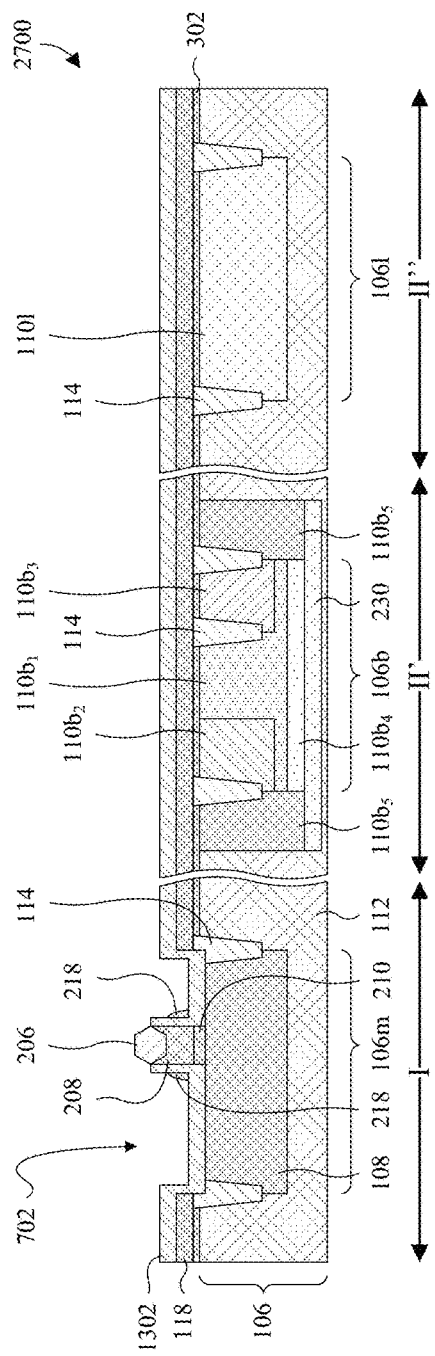

As illustrated by the cross-sectional view 2700 of FIG. 27, a floating gate dielectric layer 210, a floating gate electrode 208, and a floating gate hard mask 206 are formed stacked on the memory well 108. Further, a third gate dielectric layer 1302 is formed covering the seal layer 118 and the memory well 108. Further yet, a memory sidewall spacer 218 is formed on the third gate dielectric layer 1302, adjacent to sidewalls of the floating gate electrode 208. The forming may, for example, be performed as described with regard to FIGS. 9-14.

Figure 28:
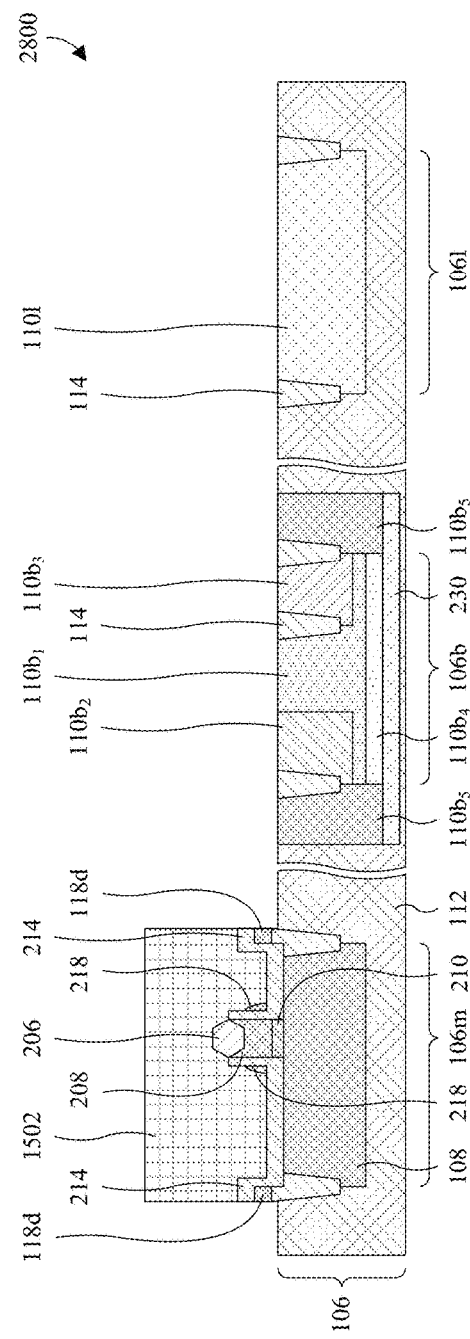

As illustrated by the cross-sectional view 2800 of FIG. 28, the third gate dielectric layer 1302 (see FIG. 27), the seal layer 118 (see FIG. 27), and the lower pad layer 302 (see FIG. 27) are patterned to remove the third gate dielectric layer 1302, the seal layer 118, and the lower pad layer 302 from the logic and BCD regions 106l, 106b of the semiconductor substrate 106. The patterning may, for example, be performed as described with regard to FIG. 15. In contrast with FIG. 15, the lower pad layer 302 is also patterned.

Figure 29:
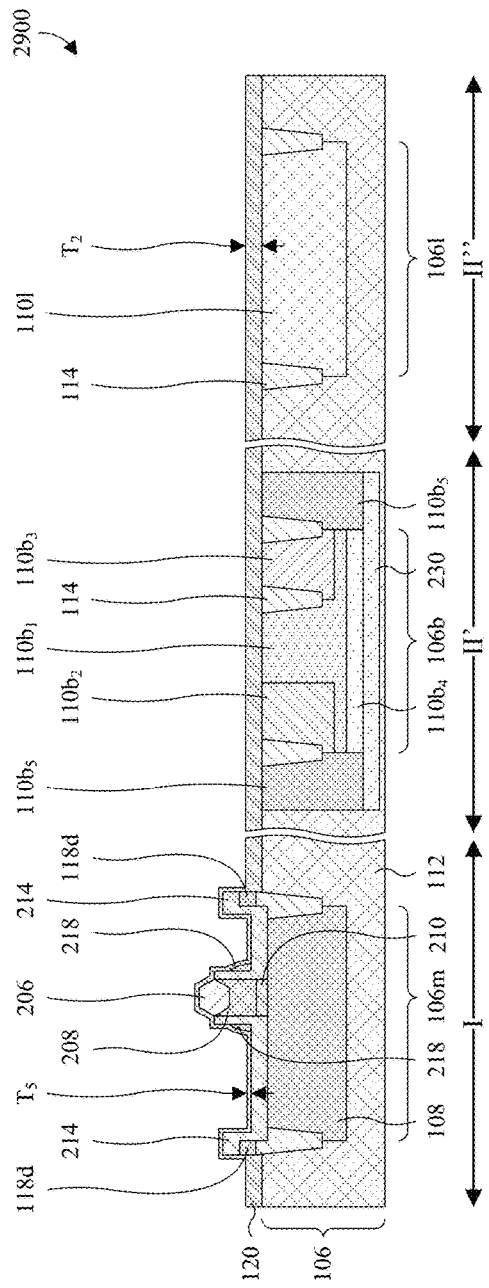

As illustrated by the cross-sectional view 2900 of FIG. 29, a first gate dielectric layer 120 is formed covering the memory, BCD, and logic regions 106m, 106b, 106l of the semiconductor substrate 106. The first gate dielectric layer 120 may be or comprise, for example, silicon oxide, some other suitable oxide(s), some other suitable dielectric(s), or any combination of the foregoing. In some embodiments, the first gate dielectric layer 120 is formed by CVD, PVD, thermal oxidation, some other suitable deposition process(es), or any combination of the foregoing.

In some embodiments in which the first gate dielectric layer 120 is formed by thermal oxidation, the first gate dielectric layer 120 forms faster on the BCD and logic regions 106b, 106l than on the memory region 106m, such that the first gate dielectric layer 120 has a second thickness $T_2$ on the BCD and logic regions 106b, 106l and a fifth thickness $T_5$ less than the second thickness $T_2$ on the memory region 106m. In some embodiments, the second thickness $T_2$ is about 60-200 angstroms, about 60-130 angstroms, about 130-200 angstroms, about 20-100 angstroms, or about 160-240 angstroms. The first gate dielectric layer 120 may, for example, form faster on the BCD and logic regions 106b, 106l than on the memory region 106m because of differences in the materials being oxidized.

Figure 30:
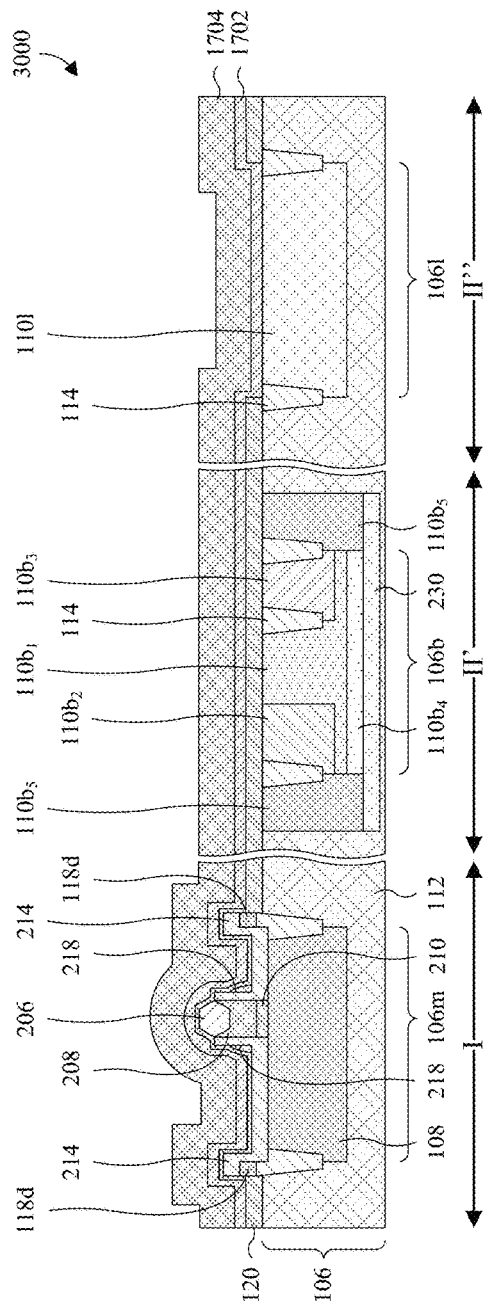

As illustrated by the cross-sectional view 3000 of FIG. 30, the first gate dielectric layer 120 is patterned to remove the first gate dielectric layer 120 from the logic well 110l. Further, a fourth gate dielectric layer 1702 and a second gate electrode 1704 are formed covering the memory, BCD, and logic regions 106m, 106b, 106l of semiconductor substrate 106. The patterning and the forming may, for example, be performed as described with regard to FIGS. 17 and 18.

Figure 31:
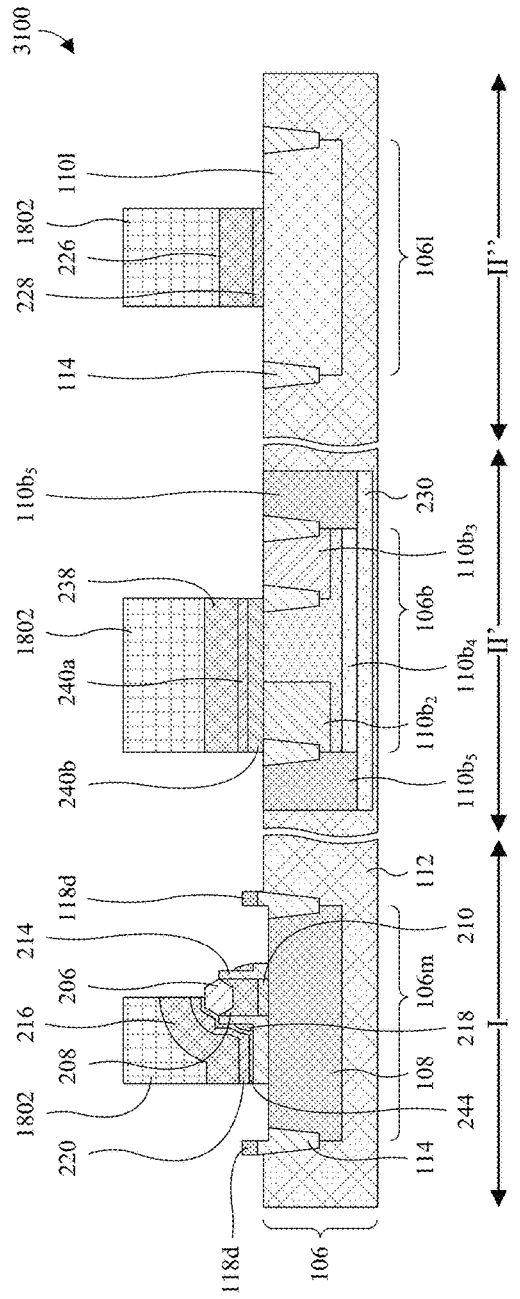

As illustrated by the cross-sectional view 3100 of FIG. 31, the second gate electrode layer 1704 (see FIG. 30), the fourth gate dielectric layer 1702 (see FIG. 30), the first gate dielectric layer 120 (see FIG. 30), and the first select gate dielectric layer 214 are patterned. The patterning forms a logic gate electrode 226 and a logic gate dielectric layer 228 stacked on the logic well 110l. Further, the patterning forms a BCD gate electrode 238 and a plurality of BCD gate dielectric layers 240a, 240b stacked on the BCD well(s) $110b_1$-$110b_5$. Further, the patterning forms a select gate electrode 216, a second select gate dielectric layer 220, and a third select gate dielectric layer 244 stacked upon one another and overlying the first select gate dielectric layer 214, the memory sidewall spacer 218, and the floating gate hard mask 206. The patterning and the forming may, for example, be performed as described with regard to FIG. 18. In contrast with FIG. 18, the patterning further forms the third select gate dielectric layer 244 and the third BCD gate dielectric layer 240c of FIG. 18 is omitted.

Figure 32:
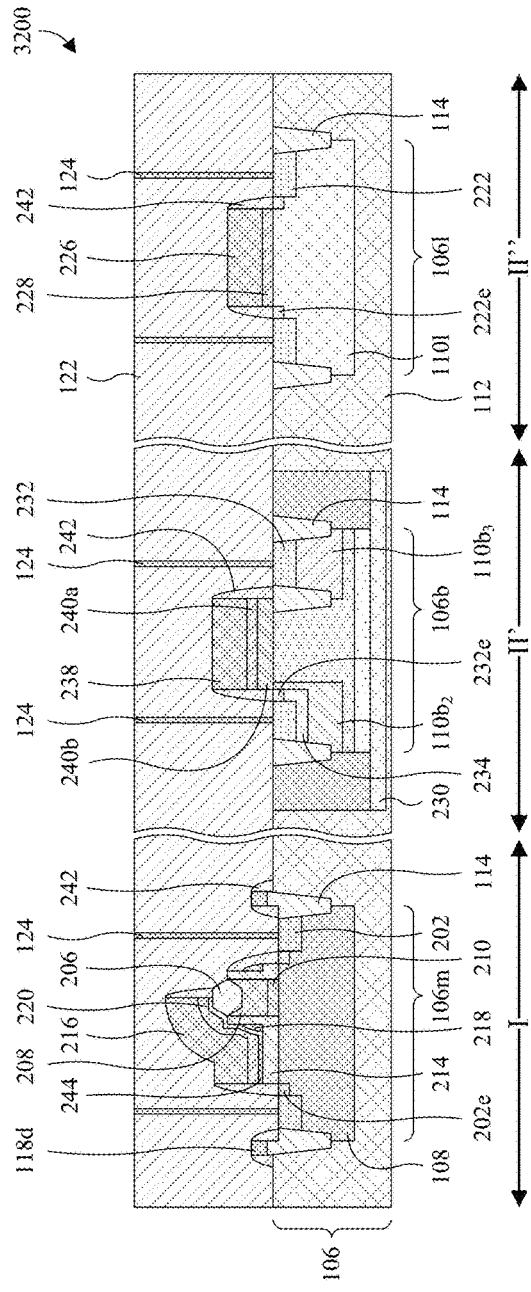

As illustrated by the cross-sectional view 3200 of FIG. 32, the BCD gate electrode 238 and the plurality of BCD gate dielectric layers 240a, 240b are further patterned, and a body well 234 is formed overlying the second BCD well $110b_2$. Further, a pair of memory source/drain extensions 202e, a BCD source/drain extension 232e, and a pair of logic source/drain extensions 222e are formed respectively overlying the memory well 108, the body well 234, and the logic well 110l. Further, main sidewall spacers 242 are formed, followed by a pair of memory source/drain regions 202, a pair of BCD source/drain regions 232, and a pair of logic source/drain regions 222. Further, an ILD layer 122 and contact vias 124 are formed. The forming may, for example, be performed as described with regard to FIGS. 19-23.

In some embodiments, the present disclosure provides a method for forming an integrated circuit, the method including: providing a semiconductor substrate including a first device region and a second device region separated by an isolation structure; forming a doped well in the second device region; forming a seal layer covering the first and second device regions, and further covering the doped well; removing the seal layer from the first device region, but not from the second device region; forming a memory cell structure on the first device region; after the forming of the memory cell structure, removing the seal layer from the second device region; and forming a device structure on the second device region. In some embodiments, the forming of the memory cell structure includes recessing a top surface of the semiconductor substrate at the first device region, but not at the second device region. In some embodiments, the method further includes forming a gate dielectric layer on the isolation structure, the first device region, and the second device region, wherein the gate dielectric layer is a different material than the seal layer and is formed after the removing of the seal layer from the second device region. In some embodiments, the method includes forming a gate dielectric layer on the isolation structure, the first device region, and the second device region, wherein the gate dielectric layer is a different material than the seal layer, and wherein the seal layer is formed covering the gate dielectric layer. In some embodiments, the seal layer includes silicon nitride, silicon carbide, polysilicon, or silicon oxynitride. In some embodiments, the memory cell structure is formed using an oxidation process. In some embodiments, the forming of the memory cell structure includes forming a memory gate dielectric layer, a memory gate electrode overlying the memory gate dielectric layer, and a memory gate hard mask overlying the memory gate electrode, wherein the memory gate dielectric layer is formed by the oxidation process. In some embodiments, the method further includes forming a second doped well in the first device region after the removing of the seal layer from the first device region and before the forming of the memory cell structure. In some embodiments, the method further includes: depositing a conductive layer covering the first and second device regions, and further covering the memory cell structure; and patterning the conductive layer to form a device gate electrode overlying the doped well and at least partially defining the device structure, and to further form a memory gate electrode bordering the memory cell structure.

In some embodiments, the present disclosure provides an integrated circuit including: a semiconductor substrate comprising a first device region and a second device region; an isolation structure extending into a top surface of the semiconductor substrate, wherein the isolation structure demarcates and separates the first and second device regions; a memory cell overlying the first device region; a MOS device overlying the second device region; and a dummy structure overlying the isolation structure, wherein the dummy structure includes a dummy seal element. In some embodiments, the dummy seal element includes silicon nitride, silicon carbide, silicon oxynitride, or polysilicon. In some embodiments, the dummy seal element directly contacts the isolation structure. In some embodiments, the dummy structure further includes a dummy dielectric element, wherein the dummy seal element overlies the dummy dielectric element. In some embodiments, the dummy structure includes a pair of dummy segments respectively on opposite sides of the memory cell. In some embodiments, the top surface of the semiconductor substrate has a first top surface portion at the first device region, and further has a second top surface portion at the second device region, wherein the first top surface portion is recessed below the second top surface portion. In some embodiments, the memory cell includes a memory gate dielectric layer and a memory gate electrode overlying the memory gate dielectric layer, wherein the first top surface portion is recessed below the second top surface portion by a recess depth, and wherein a thickness of the memory gate dielectric layer is about 1.75-2.25 times the recess depth.

In some embodiments, the present disclosure provides another method for forming an integrated circuit, the method including: forming an isolation structure in a semiconductor substrate, wherein the isolation structure demarcates a memory region of the semiconductor substrate, and further demarcates a peripheral region of the semiconductor substrate; forming a doped well in the peripheral region; forming a seal layer covering the memory and peripheral regions, and further covering the doped well; removing the seal layer from the memory region, but not the peripheral region; forming a gate dielectric layer on the memory region by a thermal oxidation process, wherein the thermal oxidation process recesses a top surface of the semiconductor substrate at the memory region, but not at the peripheral region; forming a memory gate electrode over the gate dielectric layer; after the forming of the memory gate electrode, removing the seal layer from the peripheral region; and forming a peripheral gate electrode on the peripheral region while simultaneously forming a second memory gate electrode bordering the memory gate electrode. In some embodiments, the method further includes: forming a second gate dielectric layer covering the memory and peripheral regions, and further covering the doped well, wherein the seal layer is formed covering the second gate dielectric layer; and removing the second gate dielectric layer from the memory region, but not the peripheral region, before the forming of the gate dielectric layer. In some embodiments, the method further includes: forming a second gate dielectric layer covering the memory and peripheral regions, and further covering the doped well, wherein the removing of the seal layer from the peripheral region is performed before the forming of the second gate dielectric layer; and patterning the second gate dielectric layer to form a peripheral gate dielectric layer on the peripheral region, wherein peripheral gate dielectric layer underlies the peripheral gate electrode. In some embodiments, the patterning of the second gate dielectric layer further forms a memory gate dielectric layer on the memory region, wherein the memory gate dielectric layer underlies the second memory gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit comprising:
   a semiconductor substrate comprising a first device region and a second device region;
   an isolation structure extending into a top surface of the semiconductor substrate, wherein the isolation structure demarcates and separates the first and second device regions;
   a memory cell overlying the first device region;
   a metal-oxide-semiconductor (MOS) device overlying the second device region and comprising a gate dielectric layer;
   a dummy structure overlying and directly contacting the isolation structure at a boundary of the first device region, wherein the dummy structure has a columnar profile and further has a bottom surface that is level with the gate dielectric layer of the MOS device, and wherein the dummy structure comprises a dummy seal element; and
   a sidewall spacer overlying the isolation structure and lining a sidewall of the dummy structure, wherein a bottom surface of the sidewall spacer is recessed relative to an interface at which the dummy structure and the isolation structure directly contact.

2. The integrated circuit according to claim 1, wherein the dummy seal element comprises silicon nitride, silicon carbide, silicon oxynitride, or polysilicon.

3. The integrated circuit according to claim 1, wherein the dummy seal element directly contacts the isolation structure.

4. The integrated circuit according to claim 1, wherein the dummy structure further comprises a dummy dielectric element, and wherein the dummy seal element overlies the dummy dielectric element.

5. The integrated circuit according to claim 1, wherein the top surface of the semiconductor substrate has a first top surface portion at the first device region, and further has a second top surface portion at the second device region, and wherein the first top surface portion is recessed below the second top surface portion.

6. The integrated circuit according to claim 5, wherein the memory cell comprises a memory gate dielectric layer and a memory gate electrode overlying the memory gate dielectric layer, wherein the first top surface portion is recessed below the second top surface portion by a recess depth, and wherein a thickness of the memory gate dielectric layer is about 1.75-2.25 times the recess depth.

7. An integrated circuit comprising:
a substrate comprising a first doped region and a second doped region that has a different doping type and/or a different doping concentration than the first doped region;
a semiconductor device on the first doped region;
an isolation structure neighboring the semiconductor device and extending into a top of the substrate at a sidewall boundary at which the first and second doped regions directly contact each other, wherein a top of the isolation structure has a stepped profile stepping down from a first isolation surface to a second isolation surface;
a dummy structure on the first isolation surface; and
a sidewall spacer structure on the second isolation surface and extending from the second isolation surface, along a first sidewall of the isolation structure and a first sidewall of the dummy structure, to a top of the dummy structure.

8. The integrated circuit according to claim 7, wherein the top of the isolation structure steps down from the first isolation surface to the second isolation surface towards the semiconductor device.

9. The integrated circuit according to claim 7, wherein the dummy structure comprises of a single material and directly contacts the first isolation surface, and wherein the single material is configured to block oxidants from passing through the dummy structure.

10. The integrated circuit according to claim 7, wherein the dummy structure comprises a dielectric structure and a seal structure overlying the dielectric structure, wherein the sidewall spacer structure directly contacts a sidewall of the dielectric structure and a sidewall of the seal structure, and wherein the seal structure is configured to block oxidants from passing through the seal structure.

11. The integrated circuit according to claim 7, wherein the sidewall spacer structure has a first spacer segment and a second spacer segment respectively on opposite sides of the isolation structure, wherein the first spacer segment is on the second isolation surface, the first sidewall of the isolation structure, and the first sidewall of the dummy structure, and wherein the second spacer segment is on a substrate surface of the substrate, a second sidewall of the isolation structure, and a second sidewall of the dummy structure.

12. The integrated circuit according to claim 11, wherein the sidewall spacer structure and the dummy structure are a single material and define a common structure comprising the single material, and wherein the common structure wraps around the top of the isolation structure from the second isolation surface to the substrate surface.

13. The integrated circuit according to claim 11, wherein the substrate surface is elevated above the second isolation surface and is recessed below the first isolation surface.

14. The integrated circuit according to claim 7, wherein the isolation structure has a first isolation segment and a second isolation segment that are respectively on opposite sides of the semiconductor device, and wherein the first and second isolation segments each have the stepped profile and are a mirror image of each other about a vertical axis at a center between the first and second isolation segments.

15. An integrated circuit comprising:
a substrate;
a semiconductor device on the substrate, wherein the semiconductor device comprises a gate electrode and a pair of source/drain regions between which the gate electrode is arranged;
an isolation structure extending into a top of the substrate and having a first isolation segment and a second isolation segment between which the semiconductor device is sandwiched, wherein the isolation structure comprises a dielectric material, and wherein the first and second isolation segments respectively adjoin the source/drain regions; and
a barrier structure overlying the isolation structure and having a first barrier segment and a second barrier segment respectively on the first and second isolation segments, wherein the first and second barrier segments are configured to block oxidants from passing through the barrier structure, wherein the first and second barrier segments have top surfaces recessed relative to a top surface of the semiconductor device, wherein the first barrier segment and the first isolation segment define a common sidewall that is continuous from top to bottom and that faces the semiconductor device, and wherein a bottom edge of the common sidewall is laterally offset from a neighboring one of the source/drain regions.

16. The integrated circuit according to claim 15, wherein first and second barrier segments respectively and directly contact the first and second isolation segments.

17. The integrated circuit according to claim 15, further comprising:
a dielectric structure underlying the barrier structure and having a first dielectric segment and a second dielectric segment, wherein the first and second dielectric segments respectively overlie and directly contact the first and second isolation segments, and wherein the first and second dielectric segments respectively underlie and directly contact the first and second barrier segments.

18. The integrated circuit according to claim 15, wherein the substrate comprises a first doped region completely underlying the semiconductor device and further comprises and a second doped region cupping an underside of the first doped region, wherein the first doped region is doped differently than the second doped region, and wherein the first and second isolation segments each straddle a sidewall boundary at which the first and second doped regions directly contact each other.

19. The integrated circuit according to claim 1, wherein a top surface of the isolation structure underlies and directly contacts the dummy structure, and wherein the sidewall spacer lines a sidewall of the isolation structure and is between the sidewall of the isolation structure and the memory cell.

20. The integrated circuit according to claim 15, further comprising:
a sidewall spacer overlying the first isolation segment and directly contacting the common sidewall from top to bottom.

* * * * *